(12) United States Patent
Heo et al.

(10) Patent No.: US 11,804,536 B2
(45) Date of Patent: Oct. 31, 2023

(54) THIN FILM STRUCTURE AND SEMICONDUCTOR DEVICE INCLUDING THE SAME

(71) Applicant: Samsung Electronics Co., Ltd., Suwon-si (KR)

(72) Inventors: Jinseong Heo, Seoul (KR); Taehwan Moon, Suwon-si (KR); Seunggeol Nam, Suwon-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/244,175

(22) Filed: Apr. 8, 2021

(65) Prior Publication Data

US 2021/0359101 A1    Nov. 18, 2021

(30) Foreign Application Priority Data

May 13, 2020   (KR) .................. 10-2020-0057184

(51) Int. Cl.
*H01L 29/51* (2006.01)
*H01L 29/66* (2006.01)
*H01L 29/78* (2006.01)
*H01L 21/28* (2006.01)
*H01L 49/02* (2006.01)
(Continued)

(52) U.S. Cl.
CPC ............ *H01L 29/516* (2013.01); *H01L 28/60* (2013.01); *H01L 29/0665* (2013.01); *H01L 29/40111* (2019.08); *H01L 29/42392* (2013.01); *H01L 29/6684* (2013.01); *H01L 29/7851* (2013.01);
(Continued)

(58) Field of Classification Search
CPC . H01L 29/516; H01L 27/11507; H01L 28/60; H01L 29/0665; H01L 29/40111; H01L 29/42392; H01L 29/6684; H01L 29/78391; H01L 29/7851; H01L 29/78696; H01L 21/28008; H01L 21/44; H01L 27/10805; H01L 28/40; H01L 51/0525; H01L 51/0529; H01L 51/102; H01L 21/02181; H01L 21/02189; H01L 21/02194; H01L 27/11502;
(Continued)

(56) References Cited

U.S. PATENT DOCUMENTS 7,709,359 B2   5/2010   Boescke et al.
10,468,495 B2  11/2019  Lin et al.
(Continued)

OTHER PUBLICATIONS

Extended European Search report dated Oct. 11, 2021 in European Patent Application No. 21169674.5.
(Continued)

*Primary Examiner* — Sheikh Maruf
(74) *Attorney, Agent, or Firm* — HARNESS, DICKEY & PIERCE, P.L.C.

(57) ABSTRACT

A thin film structure including ferroelectrics and anti-ferroelectrics and a semiconductor device including the same are provided. The thin film structure includes a first anti-ferroelectric layer comprising anti-ferroelectrics, a second anti-ferroelectric layer disposed apart from the first anti-ferroelectric layer and including anti-ferroelectrics, and a ferroelectric layer between the first anti-ferroelectric layer and the second anti-ferroelectric layer and including ferroelectrics.

43 Claims, 23 Drawing Sheets

(51) Int. Cl.
  *H01L 29/06* (2006.01)
  *H01L 29/423* (2006.01)
  *H01L 29/786* (2006.01)
  *H10B 53/30* (2023.01)

(52) U.S. Cl.
  CPC .. *H01L 29/78391* (2014.09); *H01L 29/78696* (2013.01); *H10B 53/30* (2023.02)

(58) Field of Classification Search
  CPC ............ H01L 27/11585; H01L 29/788; H01L 2924/1441; G11C 11/223
  USPC ......................................................... 257/295
  See application file for complete search history.

(56) References Cited

U.S. PATENT DOCUMENTS

| | | | | |
|---|---|---|---|---|
| 2009/0057737 | A1* | 3/2009 | Boescke | H01L 29/40111 |
| | | | | 257/295 |
| 2009/0302370 | A1* | 12/2009 | Guha | H01L 29/4966 |
| | | | | 438/591 |
| 2015/0054058 | A1* | 2/2015 | Seol | H01L 29/7889 |
| | | | | 257/324 |
| 2015/0263032 | A1* | 9/2015 | Shibata | H01L 29/7883 |
| | | | | 257/314 |
| 2015/0340372 | A1* | 11/2015 | Pandey | H10B 51/30 |
| | | | | 257/295 |
| 2017/0162587 | A1* | 6/2017 | Chavan | H01L 21/02164 |
| 2018/0166453 | A1* | 6/2018 | Müller | H01L 28/60 |
| 2018/0233573 | A1* | 8/2018 | Lin | H01L 29/40111 |
| 2018/0331113 | A1* | 11/2018 | Liao | H01L 28/55 |
| 2018/0366476 | A1* | 12/2018 | Liu | H01L 21/02181 |
| 2018/0374929 | A1* | 12/2018 | Yoo | H01L 29/513 |
| 2019/0019683 | A1* | 1/2019 | Yoo | H01L 29/516 |
| 2019/0027489 | A1* | 1/2019 | Orimoto | H10B 43/35 |
| 2019/0066917 | A1* | 2/2019 | Nahar | H01G 4/30 |
| 2019/0130956 | A1* | 5/2019 | Müller | G11C 11/223 |
| 2020/0055134 | A1* | 2/2020 | Heo | B23K 3/08 |

OTHER PUBLICATIONS

Kanghoon Yim et al. "NOvel high-k dielectrics for next-generation electronic devices screened by automated ab initio calculation" NPG Asia Mat. 7, e190 (2015).

Hyeon Woo Park et al. "MOdeling of Negative Capacitance in Ferroelectric Thin Films" Adv. Mat. 1805266, (2019).

M. Hoffmann et al. "Stabilizing the ferroelectric phase in doped hafnium oxide" Journal of Applied Physics, 118, (2015).

* cited by examiner

THIN FILM STRUCTURE AND SEMICONDUCTOR DEVICE INCLUDING THE SAME

CROSS-REFERENCE TO RELATED APPLICATION

This application claims the benefit of Korean Patent Application No. 10-2020-0057184, filed on May 13, 2020, in the Korean Intellectual Property Office, the disclosure of which is incorporated herein in its entirety by reference.

BACKGROUND

1. Field

The present invention relates to a thin film structure and a semiconductor device including the same.

2. Description of Related Art

Ferroelectrics are materials having ferroelectricity that maintain spontaneous polarization by aligning the internal electric dipole moments even when no electric field is applied from the outside. In other words, ferroelectrics are materials in which a polarization value (or electric field) remains semi-permanently therein, even after a constant voltage is applied and the voltage is brought back to zero volts. Research has been made to improve the performance of electronic devices by applying these ferroelectric properties to semiconductor devices. For example, studies in applying a characteristic in which the polarization value of ferroelectrics exhibits hysteresis with respect to a voltage change to memory devices has been conducted.

In addition, research results have been published recently on the possibility that the subthreshold swing may fall below 60 mV/dec, which is the theoretical limit of conventional silicon-based transistors if ferroelectrics have a negative capacitance in a specific area and are applied to transistors. For this reason, research is being conducted to utilize ferroelectrics in low-power logic devices.

Moreover, because it has been found that hafnium-based oxides have ferroelectricity, research using hafnium-based oxides in semiconductor devices has also been conducted. Hafnium oxide is expected to be useful for miniaturization of semiconductor devices because it is friendly to semiconductor processes and has ferroelectricity even in very thin films with several nanometer thicknesses.

SUMMARY

An example embodiment provides a thin film structure including ferroelectrics and anti-ferroelectrics and a method of manufacturing the same.

Another example embodiment provides a semiconductor device with improved hysteresis characteristics and an electronic device including the same.

Another example embodiment provides a thin film structure including a crystalline metal oxide layer having a concentration gradient of hafnium elements.

Additional aspects will be set forth in part in the description which follows and, in part, will be apparent from the description, or may be learned by practice of the presented embodiments of the disclosure.

According to one aspect, a stack structure may include a substrate; and a thin film structure on the substrate. The thin film structure may include a first anti-ferroelectric layer parallel to the substrate, a second anti-ferroelectric layer parallel to the substrate, and a ferroelectric layer parallel to the substrate, the ferroelectric layer between the first anti-ferroelectric layer and the second anti-ferroelectric layer. At least one of the first anti-ferroelectric layer and the second anti-ferroelectric layer may cover 80% or more of a surface of the ferroelectric layer. The first anti-ferroelectric layer and the second anti-ferroelectric layer may be in direct contact with the ferroelectric layer.

At least one of the ferroelectric layer, the first anti-ferroelectric layer, and the second anti-ferroelectric layer may independently comprises at least one of hafnium oxide ($HfO_2$), zirconium oxide ($ZrO_2$), and hafnium-zirconium oxide ($Hf_xZr_{1-x}O_2$, $0<x<1$).

The ferroelectric layer may comprise the hafnium-zirconium oxide represented by $Hf_xZr_{1-x}O_2$ ($0.2 \leq x<1$). Each of the first anti-ferroelectric layer and the second anti-ferroelectric layer may independently comprise at least one of zirconium oxide and hafnium-zirconium oxide represented by $Hf_xZr_{1-x}O_2$ ($0<x<0.2$). A hafnium element content of the ferroelectric layer may be greater than a hafnium element content of one or more of the first anti-ferroelectric layer and the second anti-ferroelectric layer. A mole ratio of a hafnium element of at least one of the first anti-ferroelectric layer and the second anti-ferroelectric layer with respect to a hafnium element of the ferroelectric layer is between 0 and 0.8.

A zirconium element content of the ferroelectric layer may be less than a zirconium element content of any one or more of the first anti-ferroelectric layer and the second anti-ferroelectric layer. A mole ratio of a zirconium element of at least one of the first anti-ferroelectric layer and the second anti-ferroelectric layer with respect to a zirconium element of the ferroelectric layer is between 1 and 100.

At least one of the ferroelectric layer, the first anti-ferroelectric layer, and the second anti-ferroelectric layer may comprise one or more dopant material. The dopant material may include at least one of C, Si, Ge, Sn, Pb, Al, Y, La, Gd, Mg, Ca, Sr, Ba, Ti, Zr, and Hf. A content of the dopant material in the ferroelectric layer may be less than a content of at least one dopant material in the first anti-ferroelectric layer and the second anti-ferroelectric layer. The ferroelectric layer may have a content of the dopant material between 0 at % and 10 at % compared to a metal element of a base material; and each of the first anti-ferroelectric layer and the second anti-ferroelectric layer independently has a content of the dopant material between 4 at % and 20 at % compared to a metal element of a base material.

The ferroelectric layer may comprise an orthorhombic crystal structure, and the first anti-ferroelectric layer and the second anti-ferroelectric layer may comprise a tetragonal crystal structure.

A thickness of each of the first anti-ferroelectric layer, the ferroelectric layer, and the second anti-ferroelectric layer may be independently between 0.1 nm and 10 nm. A ratio of a thickness of at least one of the first anti-ferroelectric layer and the second anti-ferroelectric layer with respect to the ferroelectric layer may be between 0 and 10.

The thin film structure may further include a paraelectric layer. The paraelectric layer may be between the ferroelectric layer and at least one of the first anti-ferroelectric layer and the second anti-ferroelectric layer, and may include at least one of aluminum oxide ($Al_2O_3$), lanthanum oxide ($La_2O_3$), yttrium oxide ($Y_2O_3$), and silicon oxide ($SiO_2$).

According to another aspect, a stack structure may include a substrate; and a crystalline metal oxide layer on the substrate. The crystalline metal oxide layer including at least one hafnium oxide (HfO$_2$), zirconium oxide (ZrO$_2$), and hafnium-zirconium oxide (Hf$_x$Zr$_{1-x}$O$_2$, 0<x<1), and a first surface layer portion, a central portion, and a second surface layer portion sequentially stacked in a thickness direction, and wherein a hafnium element content of the central portion is greater than a hafnium element content of one or more of the first surface layer portion and the second surface layer portion.

The stack structure and the semiconductor device may be manufactured by a method of manufacture including, forming a first amorphous layer on the substrate, forming a second amorphous layer on the substrate, forming a third amorphous layer on the substrate, annealing the first amorphous layer to form a first anti-ferroelectric layer, annealing the second amorphous layer to form a ferroelectric layer, and annealing the third amorphous layer to form a second anti-ferroelectric layer.

The first anti-ferroelectric layer, the ferroelectric layer, and the second anti-ferroelectric layer may be formed parallel to the substrate. The first amorphous layer, the second amorphous layer, and the third amorphous layer may be sequentially formed on the substrate in a thickness direction on the substrate.

The stack structure may be manufactured by performing two or more of the annealing the first amorphous layer, annealing the second amorphous layer, and annealing the third amorphous layer simultaneously.

The capacitor may be manufactured by a method of further providing an electrode on the second anti-ferroelectric layer, wherein the substrate includes a conductor.

The field effect transistor may be manufactured by further providing an electrode on the second anti-ferroelectric layer, wherein the substrate includes a semiconductor material. Further, a source and a drain may be further formed on the substrate.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
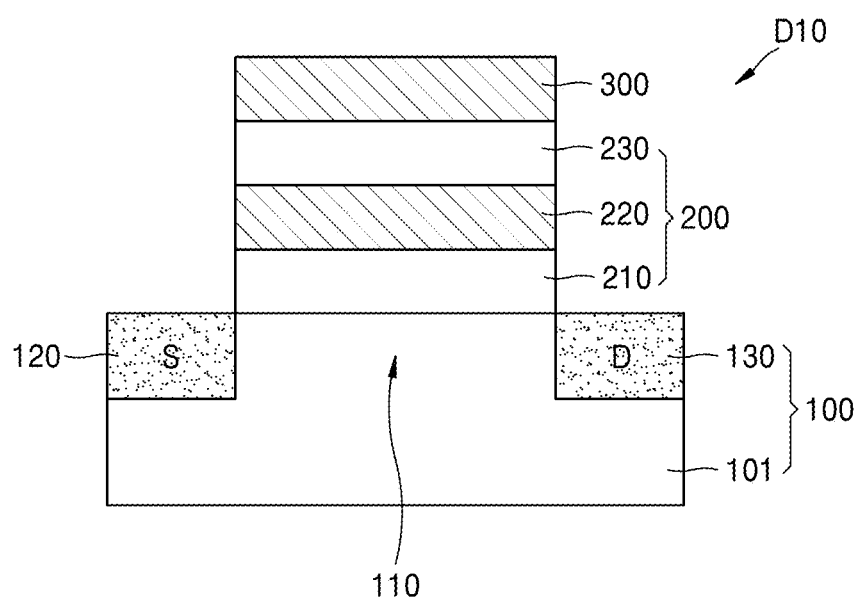
FIGS. 1 and 2 are schematic diagrams showing a semiconductor device (field effect transistor) according to some example embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in this specification are only used to describe specific embodiments, and are not intended to limit the technical spirit. What is described to be "upper" or "upper" may include those that are directly above/below/left/right in contact, as well as those that are above/below/left/right in non-contact.

The terms of a singular form may include plural forms unless otherwise specified. The terms "comprises" or "have" are intended to indicate that there are features, numbers, steps, actions, components, parts, components, materials or combinations thereof described in the specification, unless specifically stated to the contrary, and thus it should be understood that one or more other features or numbers, steps, operations, components, parts, components, materials, or combinations thereof are not excluded in advance.

Terms such as "first," "second," and "third" can be used to describe various components, but are used only to distinguish one component from other components, and the order and types of components are not limited. In addition, terms such as "unit," "means," and "module" refer to a unit of comprehensive configuration that processes at least one function or operation, and it can be implemented in hardware or software, or a combination of hardware and software.

Hereinafter, example embodiments will be described in detail with reference to the accompanying drawings. In the following drawings, the same reference numerals refer to the same components, and the sizes (widths, thicknesses of layers, areas, etc.) of each component in the drawings may be exaggerated for clarity and convenience. Meanwhile, embodiments described below are merely exemplary, and various modifications are possible from these embodiments.

According to some example embodiments, a semiconductor device including ferroelectrics and anti-ferroelectrics and an electronic device including the same may be provided. The semiconductor device may be a non-memory device, and may include, for example, a field effect transistor, a capacitor, or a combination structure thereof, but is not limited thereto. The semiconductor device may be used in various electronic devices. Such an electronic device may have advantages in terms of efficiency, speed, and power consumption compared to conventional devices.

Figure 2:
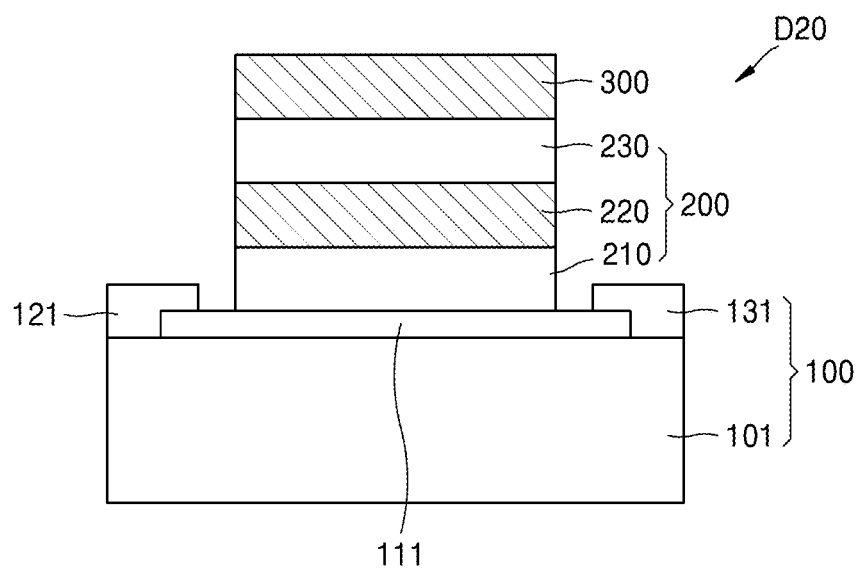

FIGS. 1 and 2 are schematic diagrams schematically showing a field effect transistor according to some example embodiments. Referring to FIGS. 1 and 2, field effect transistors D10 and D20 may include a substrate 100, a gate electrode 300 on the substrate 100, and a thin film structure 200 between the substrate 100 and the gate electrode 300. The substrate 100 may include sources 120 and 121 and drains 130 and 131 and the thin film structure may include ferroelectric and anti-ferroelectric properties. The field effect transistor may be, a logic switching device. For example, the logic switching device may represent a concept that contrasts with a memory device (e.g., a memory transistor), may have a non-memory characteristic, and may be a switching device for non-memory ON/OFF.

The substrate 100 may include a semiconductor material, (e.g., Si, Ge, SiGe, and/or III-V semiconductors) and may be implemented in various forms. For example, the substrate 100 may include a germanium-on-insulator (GOI) substrate and/or a silicon on insulator (SOI) substrate.

The substrate 100 may include sources 120 and 121 and drains 130 and 131, and channels 110 and 111 that are electrically connected to the sources 120 and 121 and the drains 130 and 131. The sources 120 and 121 may be electrically connected to one end of the channels 110 and 111, and the drains 130 and 131 may be electrically connected to the other end of the channels 110 and 111. For example, the sources 120 and 121 may contact a first end of the channels 110 and 111, while the drains 130 and 131 contact a second end of the channels 110 and 111.

Referring to FIG. 1, the channel 110 may be included in a substrate region 101, and may be between the source 120 and the drain 130 in the substrate 100. The source 120 and the drain 130 may be formed by injecting impurities into different regions of the substrate 100. For example the substrate region 101 may include a semiconductor material, and the source 120 and drain 130 may be regions of the semiconductor material doped with different impurities than the substrate region 101. The impurities in the source 120 and drain 130 may include a different charge from the substrate region 101, and/or the source 120 and drain 130 may include a different concentration of impurities from the substrate region. For example, the substrate region 101 may be P-type semiconductor and the source 120 and drain 130 may include N-type dopants. Alternatively, the substrate region 101 may be N-type semiconductor and the source 120 and drain 130 may include P-type dopants. The source 120, the channel 110, and the drain 130 may include a substrate material as a base material.

In addition, referring to FIG. 2, the channel 111 may include a material layer (e.g., a thin film) separate from the substrate region 101. The channel 111 may have a semiconductive property. For example, the channel 111 may include an oxide semiconductor, a nitride semiconductor, an oxynitride semiconductor, a two-dimensional (2D) material, a quantum dot, an organic semiconductor, and/or combinations thereof in addition to semiconductor materials such as Si, Ge, SiGe, and Group III-V semiconductors. For example, the oxide semiconductor may include InGaZnO, and the like, the 2D material may include a transition metal dichalcogenide (TMD) and/or graphene, and the quantum dot may include a colloidal quantum dot (colloidal QD), a nanocrystal structure, and the like. The source 121 and the drain 131 may include a conductive material. For example, the source 121 and the drain 131 may each independently include a metal, a metal compound, and/or a conductive polymer.

The gate electrode 300 may be on and spaced apart from the substrate 100, and may face the channels 110 and 111. The gate electrode 300 may have a sheet resistance of approximately 1 megaohm per square (MΩ/sq) or less. The gate electrode 300 may include a metal, a metal nitride, a metal carbide, polysilicon, and/or a combination thereof. For example, the metal may include aluminum (Al), tungsten (W), molybdenum (Mo), titanium (Ti), and/or tantalum (Ta); the metal nitride film may include a titanium nitride film (TiN film) and/or a tantalum nitride film (TaN film); and the metal carbide may include a metal carbide doped with aluminum and/or silicon (e.g., TiAlC, TaAlC, TiSiC, and/or TaSiC. The may include a structure in which a plurality of materials are stacked. For example, the gate electrode 300 may include a stack structure of a metal nitride layer/metal layer such as TiN/Al and/or a stack structure of a metal nitride layer/metal carbide layer/metal layer such as TiN/TiAlC/W. The gate electrode 300 may also include a titanium nitride film (TiN) and/or molybdenum (Mo), and the above example may be used in various modified forms.

The thin film structure 200 may be between the substrate 100 and the gate electrode 300. For example, the thin film structure 200 may be formed on the channels 110 and 111, and/or the gate electrode 300 may be formed on the thin film structure 200. The thin film structure 200 may include a first anti-ferroelectric layer 210, a second anti-ferroelectric layer 230 spaced apart from the first anti-ferroelectric layer 210, and a ferroelectric layer 220 between the first anti-ferroelectric layer 210 and the second anti-ferroelectric layer 230. The first anti-ferroelectric layer 210 and the second anti-ferroelectric layer 230 may include an anti-ferroelectric, and may have anti-ferroelectric properties, and the ferroelectric layer 200 may include a ferroelectric and may have ferroelectric properties. The first anti-ferroelectric layer 210, the ferroelectric layer 220, and the second anti-ferroelectric layer 230 may be, for example, sequentially arranged in the thickness direction of the thin film, and layered parallel to the substrate 100 and/or the gate electrode 300. The thin film structure 200 may form a gate stack together with the gate electrode 300.

As described above, ferroelectrics may have a negative capacitance in a specific operating region, and when ferroelectrics are applied to the gate stack of a transistor, it may lower the transistor's subthreshold swing value SS. However, because the polarization value for a voltage change has hysteresis, when ferroelectrics are applied to a logic device, for example a logic transistor, a structure to control this hysteresis may be added.

Figure 3A:
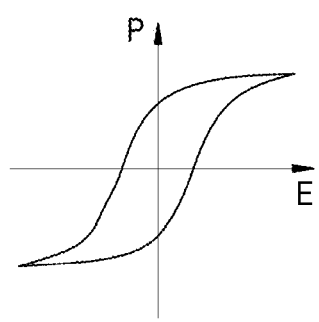
FIG. 3A is a schematic diagram of the relationship between the electric field E and polarization P applied to an example ferroelectrics and FIG. 3B is a schematic diagram of the relationship between charge Q and energy U of an example ferroelectrics.
Figure 3B:
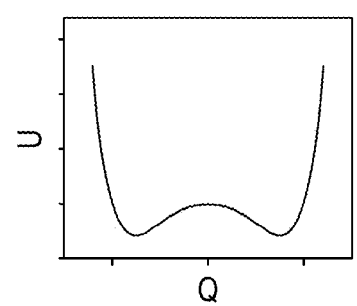
Figure 4A:
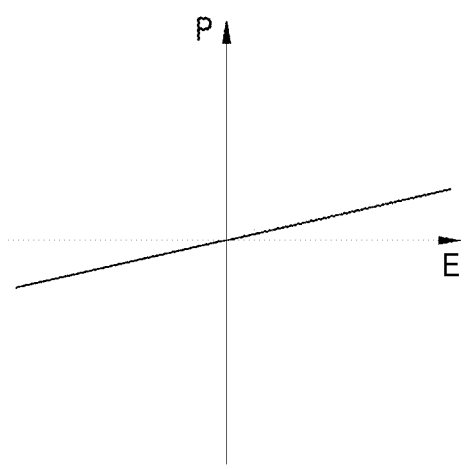
FIG. 4A is a schematic diagram of the relationship between the electric field E and polarization P applied to a dielectric and FIG. 4B is a schematic diagram of the relationship between charge Q and energy U of a dielectric.
Figure 4B:
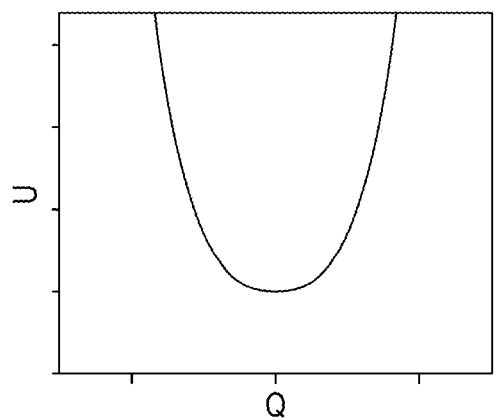

For hysteresis control, capacitance matching may be performed using ferroelectrics and dielectrics. FIG. 3A is a schematic diagram of the relationship between the electric field E and polarization P applied to an example ferroelectrics and FIG. 3B is a schematic diagram of the relationship between charge Q and energy U of an example ferroelectric. In addition, FIG. 4A is a schematic diagram of the relationship between the electric field E and polarization P applied to an example dielectric material and FIG. 4B is a schematic diagram of the relationship between charge Q and energy U of an example dielectric material. Referring to FIG. 3B, the charge Q vs. energy U graph of a ferroelectric has two wells. The two well shapes correspond to the two stable polarization states, and this graph shape represents the hysteresis behavior.

Figure 5:
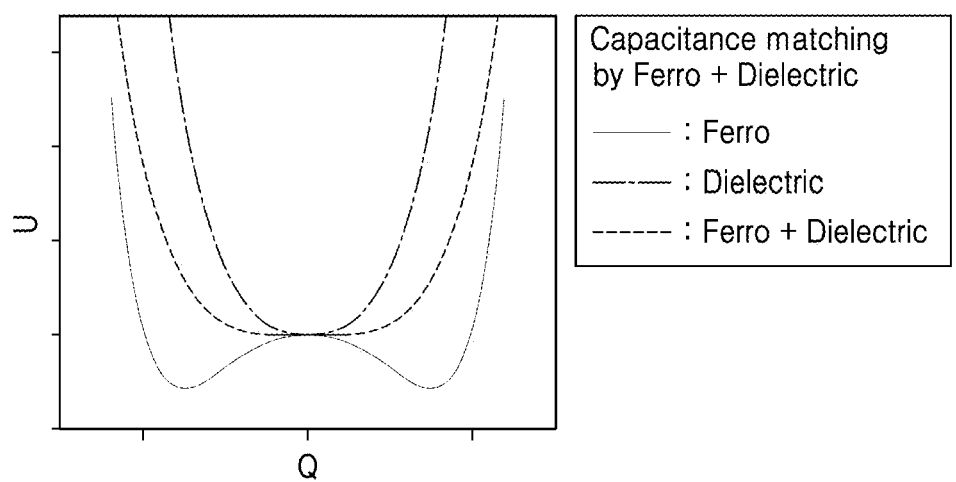
FIG. 5 is a graph conceptually showing capacitance matching using a ferroelectric and a dielectric.

FIG. 5 is a schematic diagram of a relationship between charge Q and energy U when capacitance matching is performed using a ferroelectric and a dielectric without anti-ferroelectric properties. As shown, the hysteresis is eliminated by the capacitance matching, and a relatively wide U-shaped graph may appear. However, in this case, because a dielectric having a low dielectric constant is used, when the dielectric is applied to the gate stack of the transistor, the efficiency of the gate may decrease.

Figure 6A:
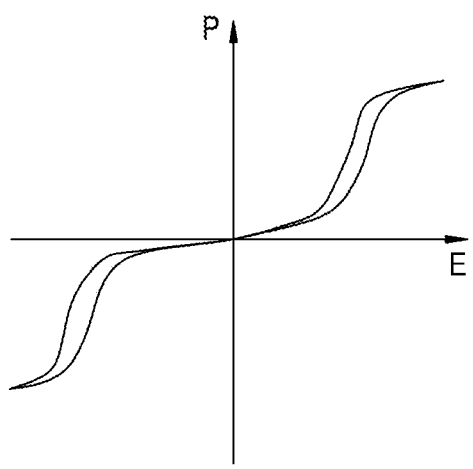
FIG. 6A is a schematic diagram of the relationship between the electric field E and polarization P applied to anti-ferroelectrics and FIG. 6B is a schematic diagram of the relationship between charge Q and energy U of anti-ferroelectrics.
Figure 6B:
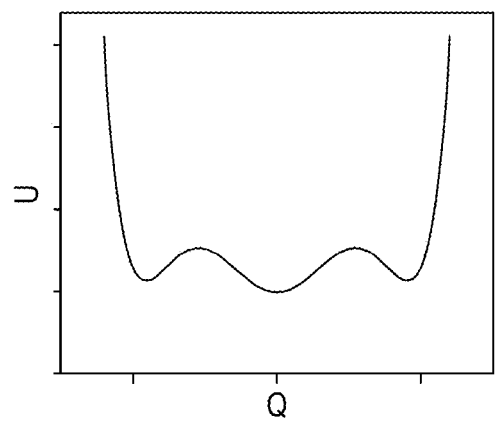
Figure 7:
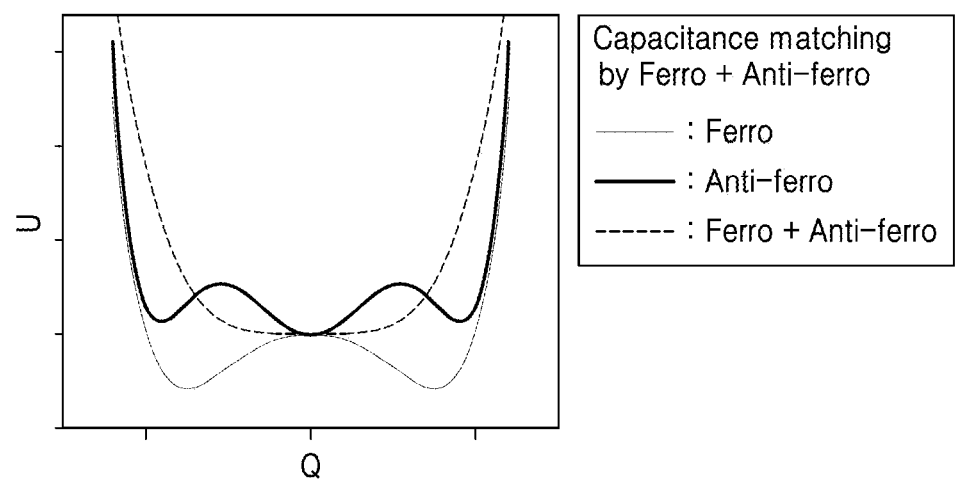
FIG. 7 is a graph conceptually showing capacitance matching using ferroelectrics and anti-ferroelectrics.

However, according to an example embodiment, capacitance matching may be performed using a ferroelectric and an anti-ferroelectric. FIG. 6A is a schematic diagram of the relationship between the electric field E and polarization P applied to an example anti-ferroelectric and FIG. 6B is a schematic diagram of the relationship between charge Q and energy U of an anti-ferroelectric. FIG. 7 is a graph conceptually showing capacitance matching using ferroelectrics and anti-ferroelectrics. As shown in FIG. 6B, the charge Q vs. energy U graph of anti-ferroelectrics has a different curve from the graph of a ferroelectrics. Therefore, as illustrated in FIG. 7, capacitance matching may be performed using ferroelectrics and anti-ferroelectrics, and the relationship between the charge Q and the energy U is illustrated as a U-shaped graph rather than the two well-shaped graph, and thus, the capacitance matched ferroelectric and anti-ferroelectric may not exhibit hysteresis behavior.

A thin film structure including the ferroelectrics and the anti-ferroelectrics may also have a lower internal polarization value than a thin film structure including the ferroelectrics and dielectric materials. Without being bound by any particular theory, the combination of ferroelectrics and dielectric materials may include dissimilar materials, for example, hafnium oxide and silicon oxide. Due to these dissimilarities in materials, an interfacial polarization may occur due to an interface trap at the interface between ferroelectrics and the dielectric materials. Unlike the ferroelectrics and dielectric materials, because ferroelectrics and anti-ferroelectrics may include similar materials, for example, hafnium oxide, zirconium oxide, and/or hafnium-zirconium oxide, there is a lower possibility of interfacial polarization due to an interface trap at the interface between the ferroelectrics and the anti-ferroelectrics. In addition, anti-ferroelectrics may have a dielectric constant that is about 10 times higher than that of a typical dielectric, and thus, may not decrease gate efficiency when applied to a gate electrode of a transistor.

In addition, when a thin film structure including a ferroelectric and an anti-ferroelectric is applied to a semiconductor device, the subthreshold swing value of the semiconductor device may be lowered. Referring to FIGS. 6A and 6B, the anti-ferroelectrics are materials that do not have a spontaneous polarization state in the absence of an electric field, but exhibit electrical properties similar to ferroelectrics when an electric field at or above a threshold intensity is present. For example, while ferroelectrics exhibit spontaneous polarization by a dipole even in the absence of an external electric field, and the polarization direction may be changed in domain units by an external electric field, anti-ferroelectrics may exhibit no or low (e.g., near zero) spontaneous polarization because, in the absence of an electric field, adjacent dipoles have the opposite direction and/or because there is no dipole. However, when there is an electric field at or above a threshold intensity, the anti-ferroelectrics may have spontaneous polarization, like the ferroelectrics, and the polarization direction may be changed in domain units. Therefore, when a voltage is applied to the semiconductor device, the subthreshold swing value SS of a device may be further lowered by voltage amplification generated when both ferroelectrics and anti-ferroelectrics are domain-switched.

Referring to FIGS. 1 and 2 again, the ferroelectric layer 220 may be between two anti-ferroelectric layers, (e.g., the first and second ferroelectric layers 210 and 230). A surface of the first and second anti-ferroelectric layers 210 and 230 may be in contact with the ferroelectric layer 220. For example, the first anti-ferroelectric layer 210 may be in contact with a lower surface of the ferroelectric layer 220 and the second anti-ferroelectric layer 230 may be in contact with an upper surface of the ferroelectric layer 220. The first and second anti-ferroelectric layers 210 and 230 may cover 80% or more of the ferroelectric layer. For example, the first and second anti-ferroelectric layers 210 and 230 may cover 85% or more, 90% or more, 95% or more, 98% or more, or 100% of the upper and/or lower surfaces of the ferroelectric layer 220. As described above, the polarization hysteresis of the ferroelectric layer 220 may be reduced by controlling the interfaces at the surfaces of the ferroelectric layer 220. The ferroelectric layer 220 may have a depolarization field, and the depolarization field may be in the opposite direction to the spontaneous polarization of ferroelectrics. The depolarization field may vary depending on the interface between the ferroelectric layer 220 and the outside. When the first and second anti-ferroelectric layers 210 and 230 are on the ferroelectric layer 220, as the proportion of the first and second anti-ferroelectric layers 210 and 230 covering the ferroelectric layer 220 increases, the depolarization field of the ferroelectric layer 220 increases, so that the total polarization value may be lowered and hysteresis may be reduced. In a comparative structure in which the ferroelectric layer 220 and the gate electrode 300 contact, unlike the structures D10 and D20 of FIGS. 1 and 2, as the ferroelectric layer 220 receives charge compensation from the gate electrode 300, spontaneous polarization of ferroelectrics may be maintained. The charge compensation from the gate electrode 300 may be controlled by the ratio of the first and second anti-ferroelectric layers 210 and 230 covering the ferroelectric layer 220. For example as the ratio increases, the total polarization value may be lowered and hysteresis may be reduced.

Accordingly, as shown in FIGS. 1 and 2, the thin film structure 200 including the stacked first anti-ferroelectric layer 210, ferroelectric layer 220, and second anti-ferroelectric layer 230 may be implemented in a device having a domain switching effect, a maximized voltage amplification effect, and a reduced hysteresis. For example, a semiconductor device including the thin film structure 200 having substantially non-hysteresis in the current I change according to the external applied voltage Vg may be implemented. For example, a field effect transistor may have a hysteresis window of 10 mV or less at an operating voltage of 1 V in voltage-to-current curves I-Vg curves.

Figure 8:
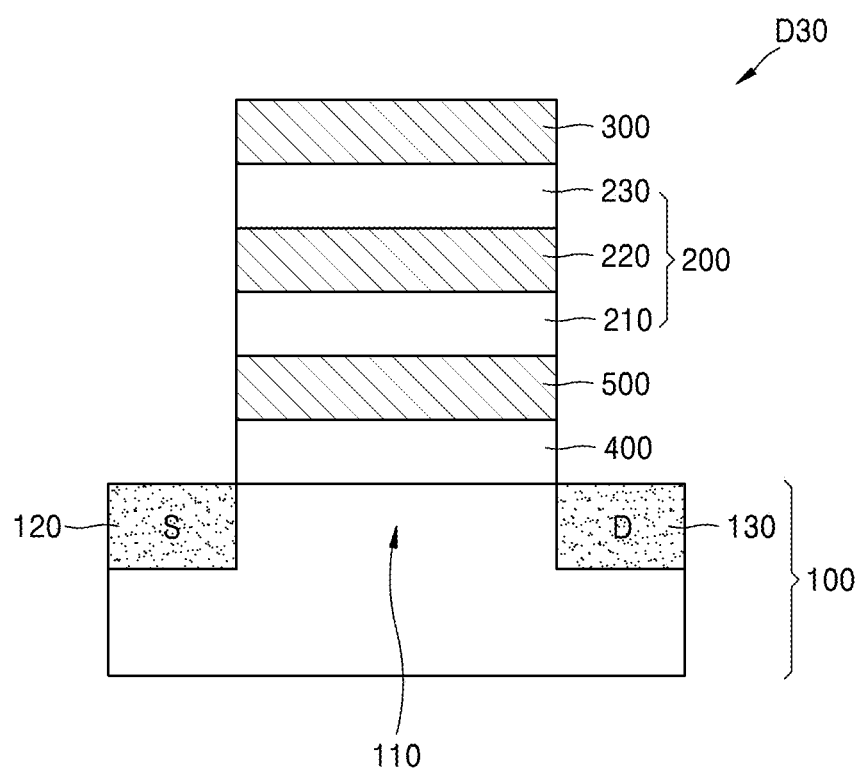
FIG. 8 is a schematic diagram showing a semiconductor device (field effect transistor) according to an example embodiment.

FIG. 8 is a schematic diagram showing a semiconductor device D30 (e.g., a field effect transistor) according to an example embodiment. Referring to FIG. 8, a dielectric layer 400 may be further included between a channel 110 and a thin film structure 200. The dielectric layer 400 may be configured to suppress and/or prevent electrical leakage. The thickness of the dielectric layer 400 may be 0.1 nm or more, 0.3 nm or more, or 0.5 nm or more, and/or may be 5 nm or less, 4 nm or less, 3 nm or less, 2 nm or less, or 1 nm or less. The dielectric layer 400 may include a paraelectric and/or a high-k dielectric material (e.g., silicon oxide, silicon nitride, aluminum oxide, hafnium oxide, zirconium oxide, or the like) and/or a 2D insulator (e.g., hexagonal boron nitride (h-BN)). For example, the dielectric layer 400 may include silicon oxide ($SiO_2$), silicon nitride ($SiN_x$), or the like. The dielectric layer 400 may also include at least one of hafnium oxide (e.g., $HfO_2$), hafnium silicon oxide (e.g., $HfSiO_4$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), tantalum oxide (e.g., $Ta_2O_5$), titanium oxide (e.g., $TiO_2$), strontium titanium oxide (e.g., $SrTiO_3$), yttrium oxide (e.g., $Y_2O_3$), aluminum oxide (e.g., $Al_2O_3$), red scandium tantalum oxide (e.g., $PbSc_{0.5}Ta_{0.5}O_3$), red zinc niobate (e.g., $PbZnNbO_3$), and/or the like. The dielectric layer 400 may also include a metal nitride oxide such as aluminum oxynitride (e.g., AlON), zirconium oxynitride (e.g., ZrON), hafnium oxynitride (e.g., HfON), lanthanum oxynitride (e.g., LaON), yttrium oxynitride (e.g., YON), and the like, silicates such as ZrSiON, HfSiON, YSiON, LaSiON, and the like, and aluminates such as ZrAlON, HfAlON, and the like.

Referring to FIG. 8, a conductive layer 500 may be between the channel 110 and the thin film structure 200. The conductive layer 500 may have a conductivity of approximately 1 MΩ/sq or less. The conductive layer 500 may be a floating electrode, and may be include a metal and/or a metal compound.

The field effect transistors D10, D20, and D30, though illustrated as a 1-gate on channel transistor, may be implemented in various forms and/or configurations. For example, field effect transistors D10, D20, and D30 may include 2-dimension and/or 3-dimension configurations. For example, the field effect transistor may have a 1-gate on channel form (e.g., a planar-FET), a 3-gate on channel form (e.g., a Fin-FET), and/or a 4-gate on channel form (e.g., a Gate-all-around-FET).

Figure 9A:
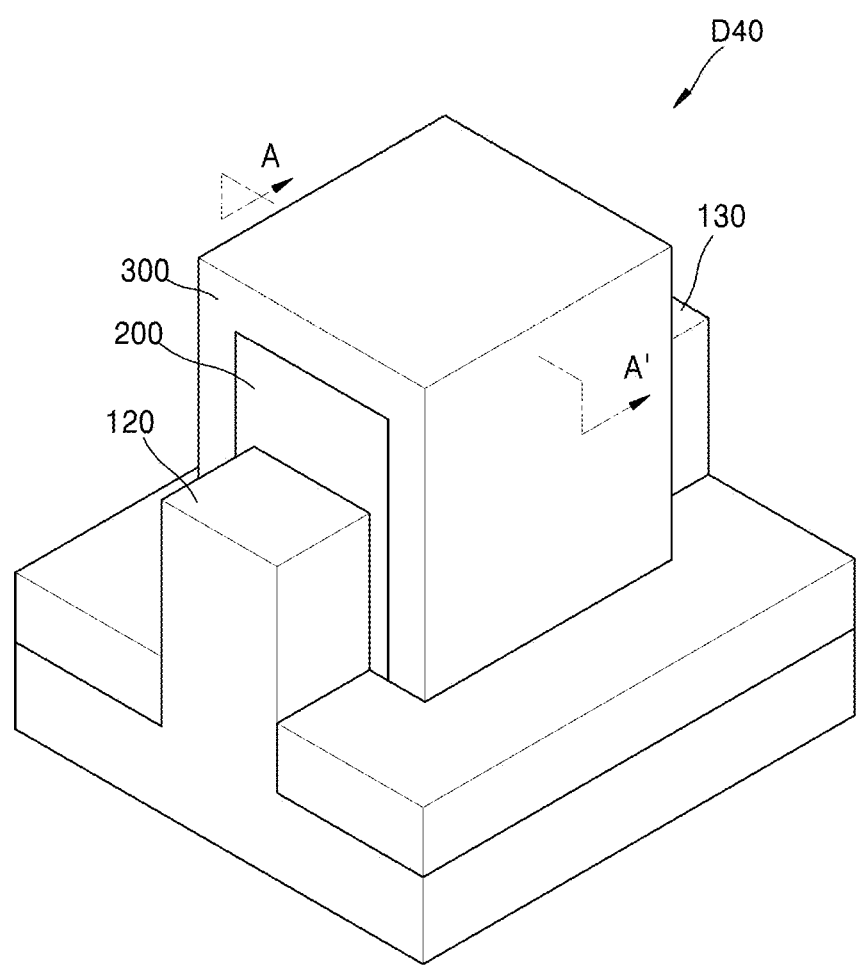
FIGS. 9A and 9B are schematic diagrams showing a semiconductor device (field effect transistor) according to an example embodiment.
Figure 9B:
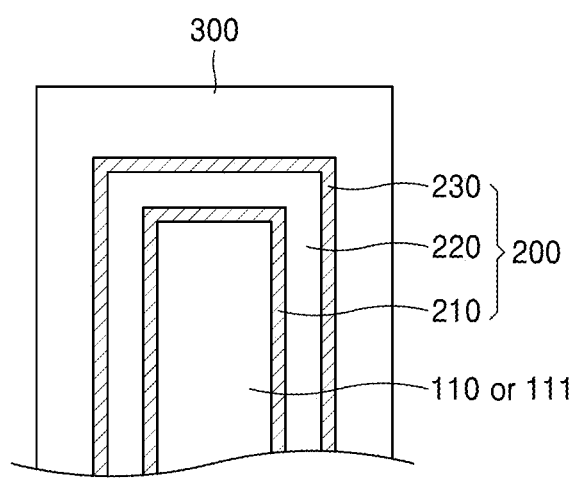

FIG. 9A is a schematic diagram showing a semiconductor device (field effect transistor) according to an example embodiment, and FIG. 9B is a cross-sectional view taken along line A-A' of FIG. 9A. Referring to FIGS. 9A and 9B, the semiconductor device may be a Fin-FET D40 and include a source 120, a drain 130, and a channel 110 or 111 therebetween. The channel 110 may be included as a section of a substrate and/or the channel 111 may include a material layer (e.g., a thin film) on the substrate. Channel 110 and/or 111 may have a fin shape. A gate electrode 300 may cross the fin shape on the substrate 100. The channel 110 or 111 may be formed in a region where the fin shape intersects with the gate electrode 300. The thin film structure 200 including the ferroelectric layer 220 and the anti-ferroelectric layer 210 and 230 may be between the channel 110 or 111 and the gate electrode 300, and the first anti-ferroelectric layer 210, the ferroelectric layer 220, and the second anti-ferroelectric layer 230 may be sequentially arranged to surround the fin shape of channel 110 and/or 111. For example, the gate electrode 300, the first anti-ferroelectric layer 210, the ferroelectric layer 220, and/or the second anti-ferroelectric layer 230 may cover the sidewalls and upper surface of the fin structure.

Figure 10A:
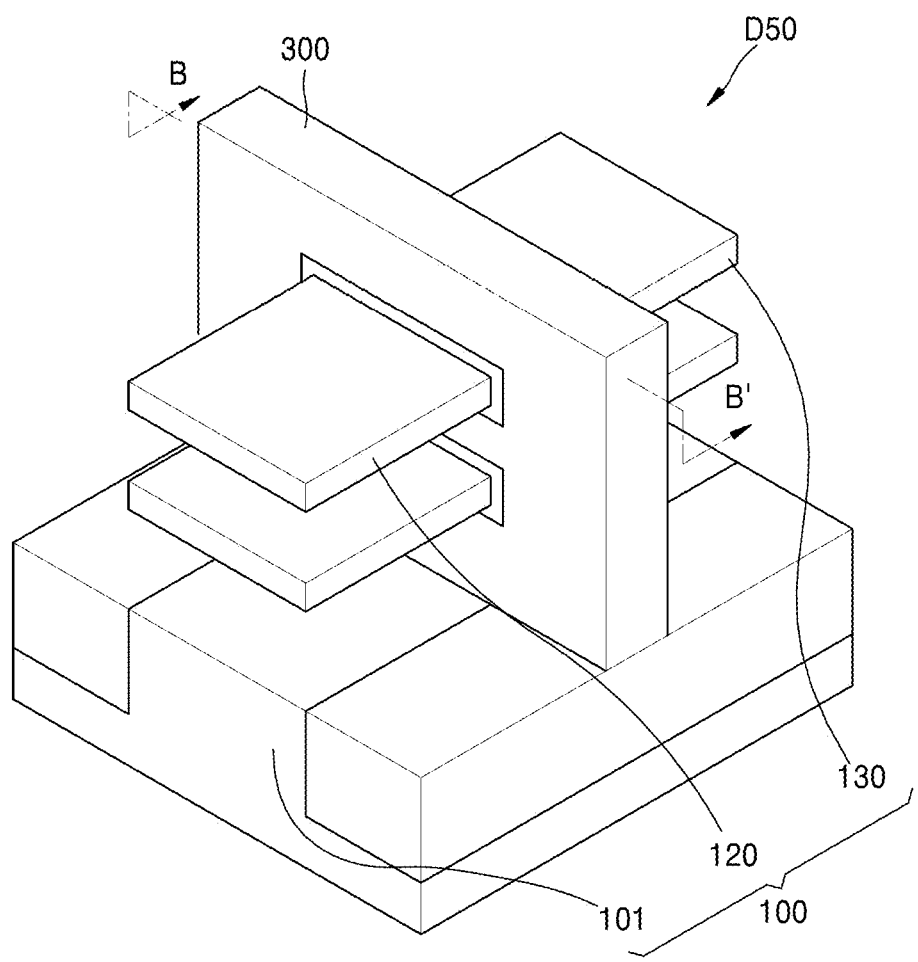
FIGS. 10A and 10B are schematic diagrams showing a semiconductor device (field effect transistor) according to an example embodiment.
Figure 10B:
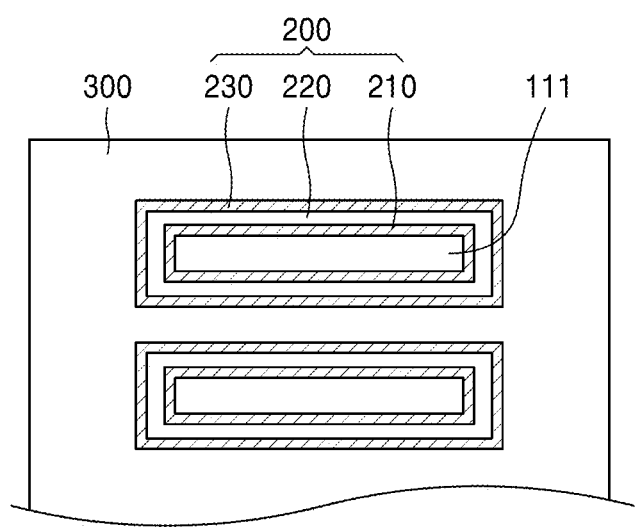

FIG. 10A is a schematic diagram showing a semiconductor device (field effect transistor) according to an example embodiment, and FIG. 10B is a cross-sectional view taken along line B-B' of FIG. 10A. Referring to FIGS. 10A and 10B, the semiconductor device may be a gate-all-around-FET D50 and include a source 120, a drain 130, and a channel 111 therebetween. The channel 111 may have a form of a wire, a sheet, or the like. The source 120, the drain 130, and the channel 111 may be disposed apart from the substrate region 101. The gate electrode 300 may be intersect with the source 120, the drain 130, and the channel 111, and surround them. The channel 111 may be formed in a region surrounded by the gate electrode 300. A thin film structure 200 including a first anti-ferroelectric layer 210, a ferroelectric layer 220, and a second anti-ferroelectric layer 230 may be between the channel 111 and the gate electrode 300. The first anti-ferroelectric layer 210, the ferroelectric layer 220, and the second anti-ferroelectric layer 230 may be sequentially surround the channel 111.

Figure 11:
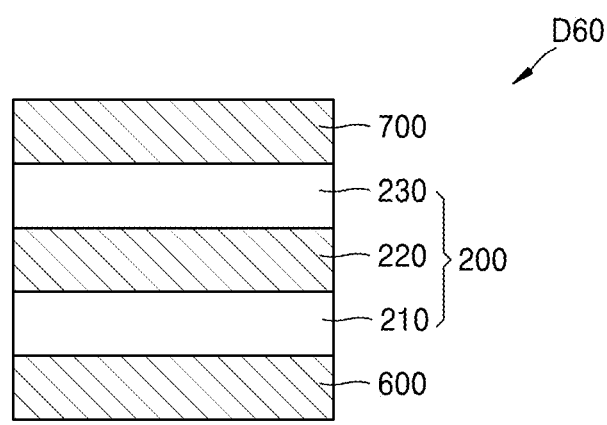
FIG. 11 is a schematic diagram showing a semiconductor device (capacitor) according to an example embodiment.

FIG. 11 is a schematic diagram schematically showing a capacitor according to an example embodiment. Referring to FIG. 11, a capacitor D60 may include a first electrode 600, a second electrode 700 facing and apart from the first electrode 600, and a thin film structure 200 between the first electrode 600 and the second electrode 700. The thin film structure 200 may include a ferroelectric layer 220 and anti-ferroelectric layers 210 and 230. The first electrode 600 and the second electrode 700 may be referred to as a lower electrode and an upper electrode, respectively. The thin film structure 200 may include a first anti-ferroelectric layer 210, a second anti-ferroelectric layer 230 facing and apart from the first anti-ferroelectric layer 210, and a ferroelectric layer 220 between the first anti-ferroelectric layer 210 and the second anti-ferroelectric layer 230. The first anti-ferroelectric layer 210, the ferroelectric layer 220, and the second anti-ferroelectric layer 230 may be sequentially arranged in the thickness direction of the thin film to be parallel to the first electrode 600 and/or second electrode 700.

The first electrode 600 and the second electrode 700 may have a conductivity of approximately 1 MΩ/sq or less, and may include the same material and/or different materials. For example, each of the first electrode 600 and the second electrode 700 may independently include at least one of TiN, TaN, Ti, Ta, TiCN, TiSiN, WSiN, TiAlN, TaAlN, TiAlCN, TiW, RuTiN, RuCN, Pt, Au, Mo, and Al. As a specific example, the first electrode 600 and the second electrode 700 may each independently include TiN and/or Mo. The thickness of each of the first electrode 600 and the second electrode 700 may be approximately 1 nm or more and/or approximately 20 nm or less, for example the thickness of the first electrode 600 and the second electrode 700 may be between 1 nm and 20 nm.

The capacitor may not substantially exhibit a hysteresis behavior. For example, the capacitor may have a coercive electric field of approximately 1 MV/cm or less in a polarization change according to an external electric field.

A field effect transistor and the capacitor may be electrically connected to form a semiconductor apparatus D70. The semiconductor apparatus D70 may have memory characteristics and may be, for example, DRAM.

Figure 12A:
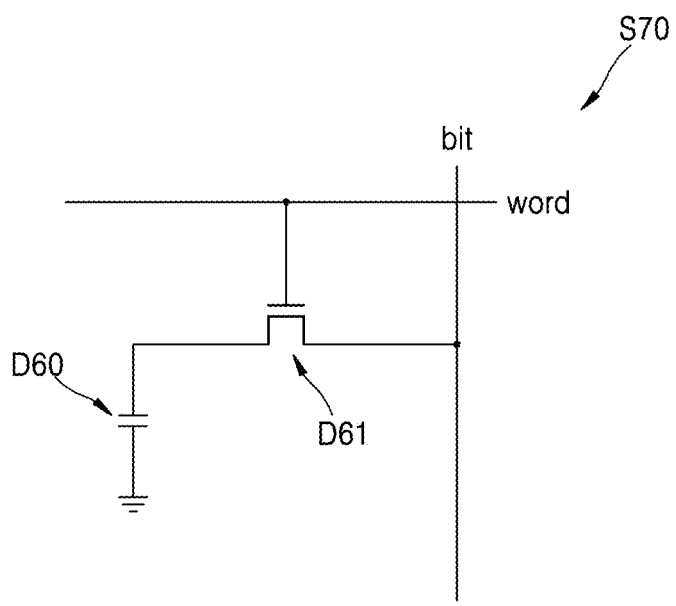
FIG. 12A illustrates a circuit configuration of a memory cell of a memory device including a semiconductor device and a capacitor.
Figure 12B:
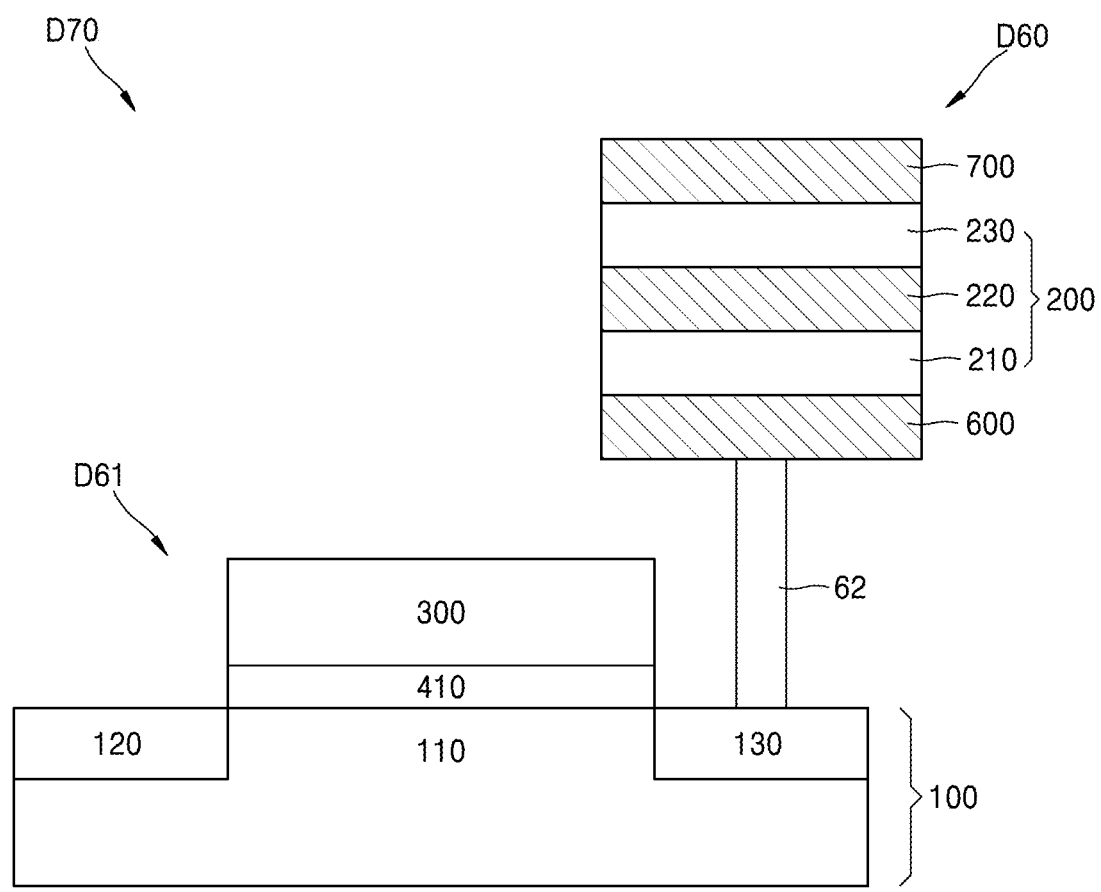
FIG. 12B is a schematic diagram showing a semiconductor apparatus according to an example embodiment.
Figure 12C:
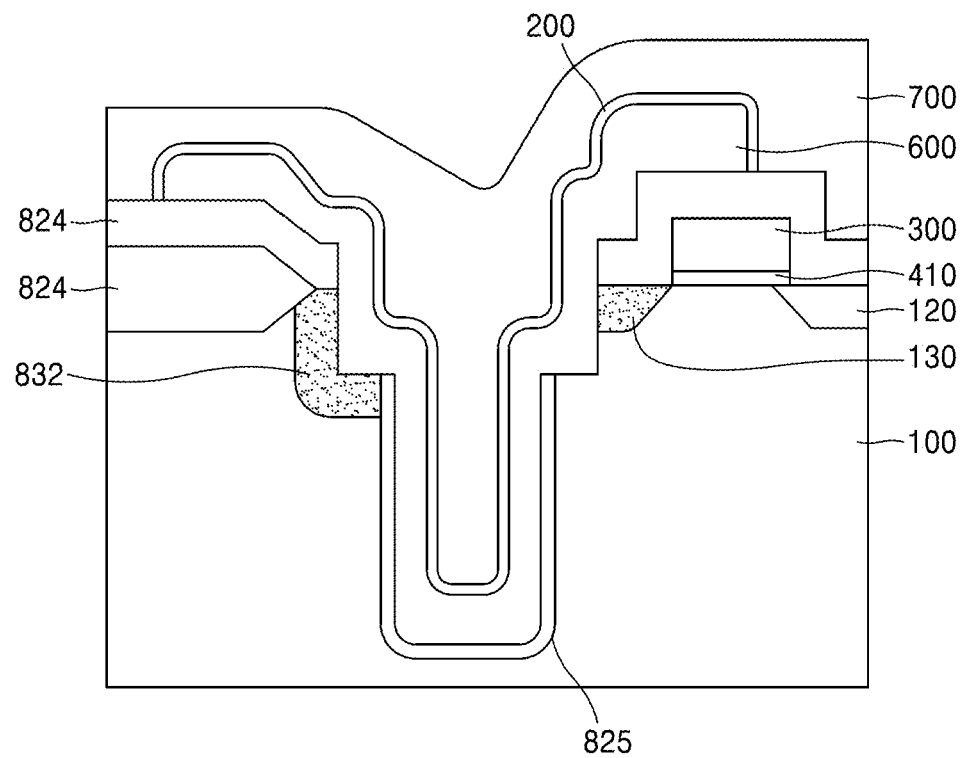
FIG. 12C is a structure of a trench capacitor-type dynamic random access memory (DRAM) according to an example embodiment.

FIG. 12A illustrates a circuit configuration of a memory cell of a memory device including a semiconductor device and a capacitor. FIG. 12B is a schematic diagram showing a semiconductor apparatus according to an example embodiment. FIG. 12C is a structure of a trench capacitor-type dynamic random access memory (DRAM) according to an example embodiment.

Referring to FIG. 12A, the semiconductor apparatus D70 may be included in a memory device as a memory cell and may include a transistor D61 and a capacitor D60 electrically connected to, for example, a source region 130 of the transistor D61. The memory device may include a plurality of bit lines and a plurality of word lines, and may further include a plurality of the memory cells. Each word line may be electrically connected to a gate electrode 300 of the transistor D61, and each bit line may be electrically connected to a drain region 120 of the transistor D61. An electrode of the capacitor D60 may be connected to, for example, a voltage controller (not shown). For example, referring to FIG. 12B, a semiconductor apparatus D70 may include a capacitor D60 including a ferroelectric layer 220 and anti-ferroelectric layers 210 and 230, and a field effect transistor D61 electrically connected to the capacitor D60 by a contact 62. One of the first and second electrodes 600 and 700 of the capacitor D60 and one of the source 120 and the drain 130 of the transistor D61 may be electrically connected by the contact 62. The contact 62 may include a conductive material, such as tungsten, copper, aluminum, polysilicon, and the like.

The field effect transistor D61 may include a substrate 100 including a source 120, a drain 130, and a channel 110, and a gate electrode 300 facing the channel 110. A dielectric layer 410 may be between the substrate 100 and the gate electrode 300. The field effect transistor D61 of FIG. 12 shows an example that does not include the thin film structure 200, but the field effect transistor may also include the thin film structure 200 as shown in FIGS. 1, 2, 8, 9A-9B, and 10A-10B. For example, the field effect transistor may be one of the field effect transistors D10, D20, D30, D40, and/or D50. The source 120, the drain 130, the channel 110, the substrate 100, and the gate electrode 300 may be the same as those described above, and the dielectric layer 410 may be the dielectric layer 400 described above.

The arrangement of the capacitor D60 and the field effect transistor D61 may be variously modified. For example, the capacitor D60 may be disposed on the substrate 100 or may be a structure embedded in the substrate 100. Referring to FIG. 12C, on a semiconductor substrate 100, a device isolation region may be defined with a field oxide film 821, and a gate electrode 300 and source/drain impurity regions 130 and 120 may be formed in the device isolation region. A dielectric layer 410 may be formed between the gate electrode 300 and the semiconductor substrate 100. An oxide film may be formed as an interlayer insulating film 824. A region not to be a trench may be capped with a trench buffer layer, and a part of the source region 130 may be open to form a contact portion.

A trench may be formed in a sidewall of the interlayer insulating film 824, and a sidewall oxide film 825 may be formed over the entire sidewall of the trench. The sidewall oxide film 825 may compensate for damage in the semiconductor substrate caused by etching to form the trench, and may serve as a dielectric film between the semiconductor substrate 100 and a first electrode 600. A sidewall portion of part of the source region 130, except for the other part of the source region near the gate electrode 823, may be entirely exposed.

A PN junction (not illustrated) may be formed in the sidewall portion of the source region by impurity implantation. The trench may be formed in the source region 130. A sidewall of the trench near the gate may directly contact the source region 130, and the PN junction may be formed by additional impurity implantation into the source region.

The first electrode 600 may be formed on part of the interlayer insulating film 824, the exposed source region 130, and the surface of the sidewall oxide film 825 in the trench. The first electrode 600 may contact the entire source region 130 in contact with the upper sidewall of the trench, in addition to the part of the source region 130 near the gate electrode 300. Next, a thin film structure 200 may be formed as a capacity dielectric film along the upper surface of the first electrode 600, and a polysilicon layer as a second electrode 700 may be formed thereon, thereby completing a trench capacitor type DRAM. Though illustrated as including the thin film structure 200 in only the capacity dielectric film, any of the gate insulting film 410, capacity dielectric film, and/or the interlayer insulating film 824, for example, may include an embodiment of the thin film structure 200, as described above.

The semiconductor device and the semiconductor apparatus may be applied to various electronic apparatuses. For example, the field effect transistors, capacitors, and/or combinations thereof described above may be applied as logic devices and/or memory devices in various electronic apparatuses. The semiconductor device according to the embodiments may be driven with low power, and, thus, may meet the needs for the miniaturization and the integration of electronic devices. The semiconductor devices and semiconductor apparatuses described may be, for example, used for arithmetic operations, program execution, temporary data maintenance, and the like in electronic apparatuses such as mobile devices, computers, notebooks, sensors, network devices, and neuromorphic devices. A semiconductor device and a semiconductor apparatus according to some example embodiments may be useful for electronic apparatuses in which data transmission volume is large and data transmission is continuously performed.

Figure 13:
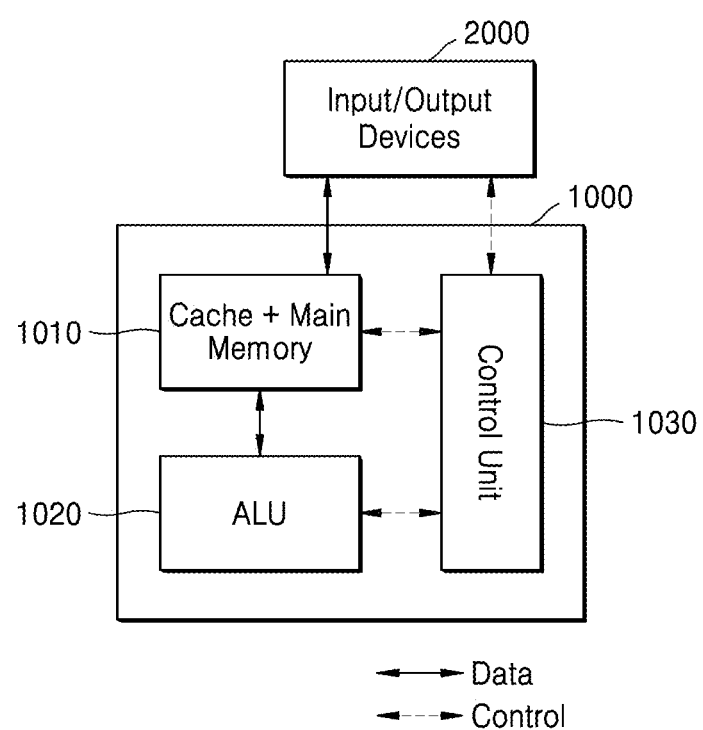
FIGS. 13 and 14 are conceptual diagrams schematically showing an device architecture that may be applied to an electronic apparatus according to some example embodiments.
Figure 14:
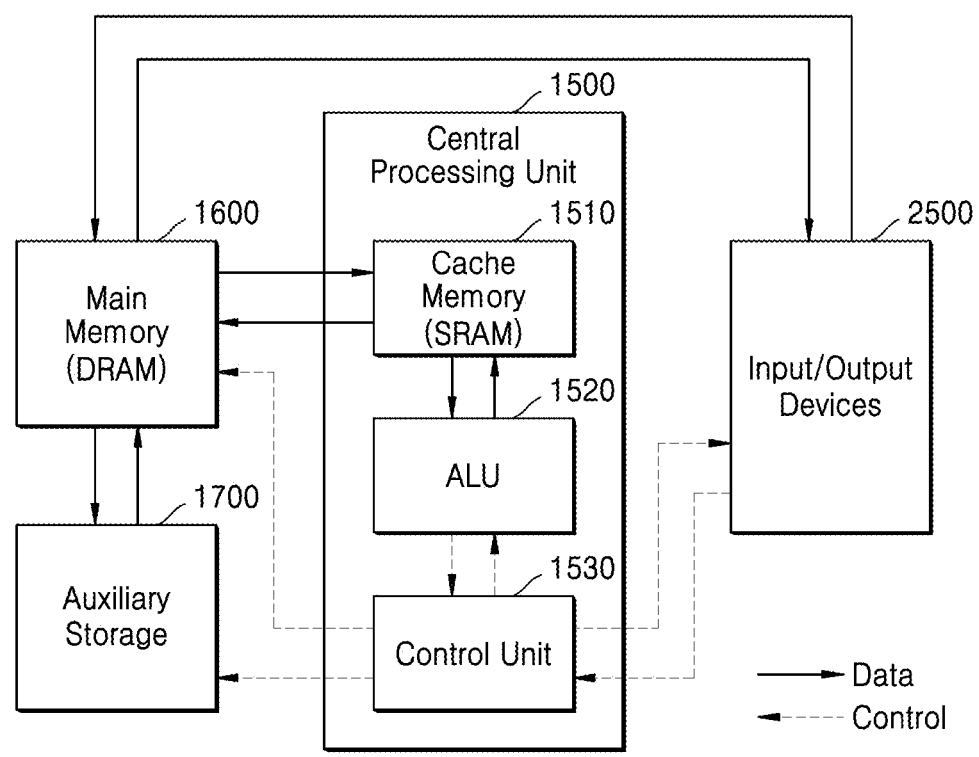

FIGS. 13 and 14 are conceptual diagrams schematically showing an electronic apparatus architecture that may be applied to an electronic device according to some example embodiments.

Referring to FIG. 13, an electronic device architecture 1000 may include a memory unit 1010, an arithmetic logic unit (ALU) 1020, and a control unit 1030. The memory unit 1010, the ALU 1020, and the control unit 1030 may be electrically connected to each other. In an example embodiment, the electronic device architecture 1000 may be implemented as a single chip including the memory unit 1010, the ALU 1020, and the control unit 1030. For example, the memory unit 1010, the ALU 1020, and the control unit 1030 may be directly connected to each other by being interconnected from an on-chip to a metal line. The memory unit 1010, the ALU 1020, and the control unit 1030 may be monolithically integrated on one substrate to form one chip. Input/output devices 2000 may be connected to the electronic device architecture 1000 (chip). In another example embodiment, the memory unit 1010, the ALU 1020, and the control unit 1030 may be implemented as separate components communicatively coupled together via a bus (not illustrated).

The memory unit 1010, the ALU 1020, and the control unit 1030 may each independently include the semiconductor device (field effect transistor, capacitor, and/or the like) described above. For example, the ALU 1020 and the control unit 1030 may each independently include the above-described field effect transistor, and the memory unit 1010 may include the capacitors, the field effect transistor, and/or the combinations thereof described above. The memory unit 1010 may include both a main memory and a cache memory. The electronic device architecture 1000 (chip) may be an on-chip memory processing unit.

Referring to FIG. 14, a cache memory 1510, an ALU 1520, and a control unit 1530 may constitute a Central Processing Unit (CPU) 1500. The cache memory 1510 may be static random access memory (SRAM), and may include one of the field effect transistors D10-D50 described above. Separately from the CPU 1500, a main memory 1600 and an auxiliary storage 1700 may be provided. The main memory 1600 may be dynamic random access memory (DRAM) and may include the transistors D10-D50 and/or the capacitor D60 described above.

In some example embodiments, the electronic device architecture may be implemented in a form in which computing unit devices and memory unit devices are adjacent to each other in one chip, without distinction of sub-units.

Figure 15:
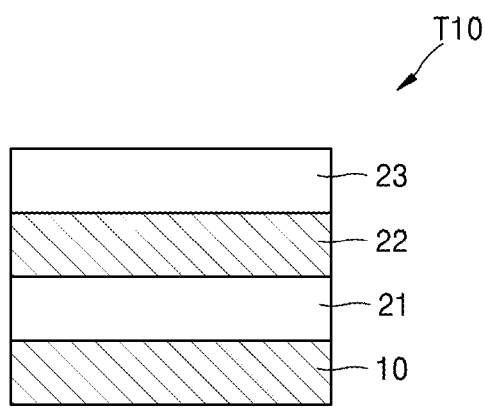
FIGS. 15 and 16 are schematic diagrams showing thin film structures according to some example embodiments.
Figure 16:
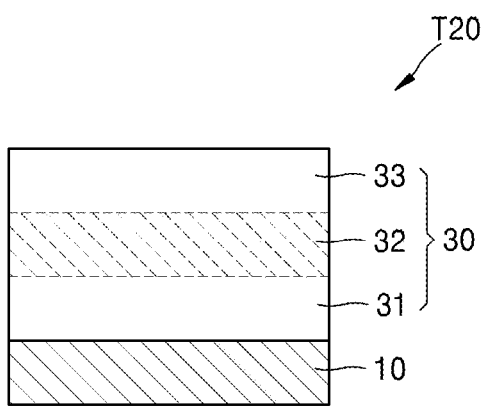

FIGS. 15 and 16 are schematic diagrams showing a stack structure according to some example embodiments. Hereinafter, the configuration and composition of the thin film structure described above will be described in detail. Specifically, referring to FIG. 15, a stack structure T10 may include a first anti-ferroelectric layer 21 on a substrate 10, a second anti-ferroelectric layer 23 facing and apart from the first anti-ferroelectric layer 21, and a ferroelectric layer 22 between the first anti-ferroelectric layer 21 and the second anti-ferroelectric layer 23. The first anti-ferroelectric layer 21 and the second anti-ferroelectric layer 23 may be in contact with a top and bottom surface of the ferroelectric layer 22, and may be arranged to cover 80% or more, 85% or more, 90% or more, 95% or more, 98% or more, or 100% of their respective surfaces of the ferroelectric layer 22. In addition, the first anti-ferroelectric layer 21, the ferroelectric layer 22, and the second anti-ferroelectric layer 23 may be sequentially arranged in the thickness direction of the thin film to be parallel to the substrate 10. When the stack structure T10 is applied to a semiconductor device, the substrate 10 may be one of the components of the semiconductor device. For example, when the stack structure T10 is applied to the field effect transistors D10, D20, D30, D40, and D50, the substrate 10 may be a semiconductor substrate 100, a gate electrode 300, channels 110 and 111, a dielectric layer 400, and/or a conductive layer 500. In addition, when the stack structure T10 is applied to the capacitors D60 and D70, the substrate 10 may be one of the first electrode 600 or the second electrode 700.

The ferroelectric layer 22 include a ferroelectric. As described above, ferroelectrics have spontaneous polarization even in the absence of an external electric field, and have two stable polarization states (see FIG. 3) in the charge Q vs. energy U relationship.

The first anti-ferroelectric layer 21 and the second anti-ferroelectric layer 23 include anti-ferroelectrics. The anti-ferroelectrics of the first anti-ferroelectric layer 21 and the second anti-ferroelectric layer 23 may be the same or different. As described above, anti-ferroelectrics do not have a spontaneous polarization state in the absence of an electric field, but may exhibit electrical properties similar to ferroelectrics in a state in which an electric field have a threshold is present. Therefore, the anti-ferroelectric may have two hysteresis loops in the relationship between the electric field E and the polarization P (see FIG. 6).

According to one example embodiment, ferroelectrics and anti-ferroelectrics may include hafnium oxide ($HfO_2$), zirconium oxide ($ZrO_2$), hafnium-zirconium oxide ($Hf_xZr_{1-x}O_2$, 0<x<1), and/or combinations thereof. These metal oxides may exhibit ferroelectric or anti-ferroelectric properties even in very thin films of several nm level, and are applicable to existing silicon-based semiconductor device processes, so that high mass productivity is possible.

The ferroelectrics and anti-ferroelectrics may be classified according to composition, the type and/or ratio of doping elements, and/or crystal structure. For example, ferroelectricity and anti-ferroelectricity may vary depending on the composition of the metal oxide, and even if the composition of the base material (e.g., the metal oxide) is the same, the ferroelectricity and the anti-ferroelectricity may vary depending on a crystal structure and/or the type and/or ratio of dopant materials. Here, the type and content of each element may be measured according to methods known in the art. For example, X-ray photoelectron spectroscopy (XPS), Auger electron spectroscopy (AES), inductively coupled plasma (ICP), and the like may be used to determine the composition and/or configuration of the elements in the ferroelectric and anti-ferroelectric.

In some example embodiments, the hafnium element content of the ferroelectric layer 22 may be greater than the hafnium element content of the first anti-ferroelectric layer 21 and/or the second anti-ferroelectric layer 22. For example, the mole ratio of the hafnium element of the first anti-ferroelectric layer 21 and/or the second anti-ferroelectric layer 22 to the hafnium element of the ferroelectric layer 22 may be independently 0 or more, 0.05 or more, 0.1 or more, 0.15 or more, 0.2 or more, and/or 0.3 or more. The mole ratio of the hafnium element of the first anti-ferroelectric layer 21 and/or the second anti-ferroelectric layer 22 to the hafnium element of the ferroelectric layer 22 may also be less than 1, 0.8 or less, 0.7 or less, and/or 0.6 or less. In addition, in some example embodiments, the zirconium element content of the ferroelectric layer 22 may be less than the zirconium element content of the first anti-ferroelectric layer 21 and/or the second anti-ferroelectric layer 23. For example, the mole ratio of the zirconium element of the first anti-ferroelectric layer 21 or the second anti-ferroelectric layer 23 to the zirconium element of the ferroelectric layer 22 may be independently greater than 1, 1.1 or more, 1.2 or more, and/or 1.5 or more. The mole ratio of the zirconium element of the first anti-ferroelectric layer 21 or the second anti-ferroelectric layer 23 to the zirconium element of the ferroelectric layer 22 independently may also be 100 or less, 75 or less, 60 or less, 50 or less, 40 or less, 30 or less, 25 or less, 20 or less, or 10 or less.

The ferroelectric layer 22 may include hafnium-zirconium oxide. The hafnium-zirconium oxide may be represented by $Hf_xZr_{1-x}O_2$ (0.2≤x<1.0). For example, the hafnium element content x of the ferroelectric layer 22 may be 0.25 or more, 0.3 or more, or 0.4 or more. The hafnium element content x of the ferroelectric layer 22 may also be less than 0.95, less than 0.9, less than 0.8, less than 0.7, or less than 0.6. In addition, the first anti-ferroelectric layer 21 and the second anti-ferroelectric layer 23 may each independently include zirconium oxide and/or hafnium-zirconium oxide represented by $Hf_xZr_{1-x}O_2$ (0<x<0.2). For example, the first anti-ferroelectric layer 21 and the second anti-ferroelectric layer 23 each independently have a hafnium element content x of 0.01 or more, 0.03 or more, 0.05 or more, and/or 0.08 or more, and/or 0.18 or less, 0.15 or less, 0.12 or less, and/or 0.1 or less. The first anti-ferroelectric layer 21 and/or the second anti-ferroelectric layer 23 may also include zirconium oxide having a hafnium element content x of zero.

In addition, the ferroelectric layer 22 and the anti-ferroelectric layers 21 and 23 may each independently include (e.g., as a base material) hafnium oxide ($HfO_2$), zirconium oxide ($ZrO_2$), hafnium-zirconium oxide ($Hf_xZr_{1-x}O_2$, 0<x<1.0), and/or combinations thereof, and may further include a dopant material (e.g., at least one of C, Si, Ge, Sn, Pb, Al, Y, La, Gd, Mg, Ca, Sr, Ba, Ti, Zr, and/or Hf). The dopant material content of the ferroelectric layer 21 may be less than the dopant material content of the first anti-ferroelectric layer 21 and/or the second anti-ferroelectric layer 23. For example, the ferroelectric layer 22 may have a dopant material content of more than 0 at %, 0.2 at % or more, 0.5 at % or more, 1 at % or more, 2 at % or more, 3 at % or more, and/or 10 at % or less, 8 at % or less, 7 at % or less, 6 at % or less, compared to the metal element of the base material. For example, the ferroelectric layer 22 may have a dopant material content may be between 0 at % and 10 at % compared to the metal element of the base material. In addition, the first anti-ferroelectric layer 21 and/or the second anti-ferroelectric layer 23 each independently may have a dopant material content of 4 at % or more, 6 at % or more, 7 at % or more, 8 at % or more, and/or 20 at % or less, 18 at % or less, 15 at % or less, or 12 at % or less compared to the metal element of the base material. For example, the anti-ferroelectric layers 21 and 23 may both and/or independently have a dopant material content between 4 at % and 20 at % compared to the metal element of the base material.

The ferroelectric layer 22 and the first and second anti-ferroelectric layers 21 and 23 may each have a different crystal structure distribution. For example, the ferroelectric layer 22 may include an orthorhombic crystal phase, and the first and second anti-ferroelectric layers 21 and 23 may include a tetragonal crystal phase. For example, in some cases, the ferroelectric layer 22 and the first and second anti-ferroelectric layers 21 and 23 may each independently include both orthorhombic crystal structure and tetragonal crystal structure, but the ferroelectric layer 22 may include more of the orthorhombic crystal structure than the tetragonal crystal structure, and the first and second anti-ferroelectric layers 21 and 23 may include more of the tetragonal crystal structure than the orthorhombic crystal structure. The crystal structure distribution may be confirmed by a method known in the art, for example, Transmission electron microscopy (TEM), Grazing Incidence X-ray Diffraction (GIXRD), and the like.

The thickness of the first anti-ferroelectric layer 21, the ferroelectric layer 22, and the second anti-ferroelectric layer 23 may be independently greater than 0 nm, 0.1 nm or more, 0.2 nm or more, 0.3 nm or more, 0.4 nm or more, 0.5 nm or more, 0.6 nm or more, 0.7 nm or more, 0.8 nm or more, 1.0 nm or more, and/or 1.5 nm or more. The thickness of the first anti-ferroelectric layer 21, the ferroelectric layer 22, and the second anti-ferroelectric layer 23 may also be independently 10 nm or less, 8 nm or less, 6 nm or less, 5 nm or less, 4 nm or less, 3 nm or less, 2 nm or less, and/or 1 nm or less. For example, the thickness of the first anti-ferroelectric layer 21, the ferroelectric layer 22, and the second anti-ferroelectric layer 23 may be between 0 nm and 10 nm. In addition, a ratio of the thickness of the first anti-ferroelectric layer 21 and/or the second anti-ferroelectric layer 23 with respect to the ferroelectric layer 22 may be independently greater than 0, greater than 0.05, greater than 0.1, greater than 0.15, greater than 0.2, greater than 0.3, 0.4 or more, 0.5 or more, 0.6 or more, 0.8 or more, 1.0 or more, 1.2 or more, and/or 1.5 or more, and/or may also be 10 or less, 8 or less, 7 or less, 6 or less, 5 or less, 4 or less, and/or 3 or less. For example, in an example embodiment, wherein the stack structure T10 is applied in the field effect transistors D10, D20, D30, D40, and D50, the sum of the thicknesses of the first anti-ferroelectric layer 21, the ferroelectric layer 22, and the second anti-ferroelectric layer 23 may be greater than 0 and less than or equal to 5 nm, and/or the thickness of the first anti-ferroelectric layer 21, the ferroelectric layer 22, and the second anti-ferroelectric layer 23 may be independently greater than 0 and less than or equal to 3 nm, and/or the thickness ratio of the first anti-ferroelectric layer 21 or the second anti-ferroelectric layer 23 with respect to the ferroelectric layer 22 may be independently greater than 0 and less than or equal to 3. In addition, when the stack structure T10 is applied in the capacitors D60 and D70, the sum of the thicknesses of the first anti-ferroelectric layer 21, the ferroelectric layer 22, and the second anti-ferroelectric layer 23 may be greater than 0 and less than or equal to 10 nm, and/or the thickness of the first anti-ferroelectric layer 21, the ferroelectric layer 22, and the second anti-ferroelectric layer 23 may each independently be greater than 0 and less than or equal to 5 nm, and/or the thickness ratio of the first anti-ferroelectric layer 21 or the second anti-ferroelectric layer 23 with respect to the ferroelectric layer 22 may be independently greater than 0 and less than or equal to 5. The thickness may be measured according to a known method in the art, for example, an ellipsometer (SE MG-1000, Nano View) or the like.

A boundary at the interface between the first anti-ferroelectric layer 21, the ferroelectric layer 22, and the second anti-ferroelectric layer 23 may be unclear. For example, the boundary between the first anti-ferroelectric layer 21 and the ferroelectric layer 22, between the ferroelectric layer 22 and the second anti-ferroelectric layer 23, and/or between all of them may be unclear. For example, if the first anti-ferroelectric layer 21, the ferroelectric layer 22, and/or the second anti-ferroelectric layer 23 comprise similar compositions and/or have a small thickness the boundary with the adjacent layer may not be clearly distinguished due to, for example, material diffusion between the layers.

The stack structure T10 may further include a paraelectric layer. Without being bound by any particular theory, the paraelectric layer may help control leakage currents that may occur between crystals in the ferroelectric layer 22 and the first and second anti-ferroelectric layers 21 and 23. The paraelectric layer may be between the ferroelectric layer 22 and the first anti-ferroelectric layer 21, and/or between the ferroelectric layer 22 and the second anti-ferroelectric layer 23. For example, stack structure T10 may include a first paraelectric layer between the ferroelectric layer 22 and the first anti-ferroelectric layer 21 and/or a second paraelectric layer between ferroelectric layer 22 and the second anti-ferroelectric layer 23. Without being bound by any particular theory, the paraelectric layer may separate the ferroelectric layer 22 and at least one of the first and second anti-ferroelectric layers 21 and 23 to control material diffusion between each layer. The paraelectric layer may include materials having a breakdown voltage greater than that of the ferroelectric layer 22 and the first and second anti-ferroelectric layers 21 and 23. The paraelectric layer may include, for example, one or more of aluminum oxide ($Al_2O_3$), lanthanum oxide ($La_2O_3$), yttrium oxide ($Y_2O_3$), silicon oxide ($SiO_2$), and/or combinations thereof.

According to an example embodiment, the thin film structure may include a crystalline metal oxide layer including a hafnium element. Referring to FIG. 16, the stack structure T20 may include a crystalline metal oxide layer 30 including at least one of hafnium oxide ($HfO_2$), zirconium oxide ($ZrO_2$), hafnium-zirconium oxide ($Hf_xZr_{1-x}O_2$, 0<x<1), and/or combinations thereof on a substrate 10. The crystalline metal oxide layer 30 may have a concentration gradient of hafnium elements in the thickness direction. For example, the metal oxide layer 30 may have a first surface layer portion 31, a central portion 32, and a second surface layer portion 33 sequentially stacked in the thickness direction, and the hafnium element content of the central portion 32 may be greater than the hafnium element content of the first surface layer portion 31 and/or the second surface layer portion 33. For example, the mole ratio of the hafnium elements of the first surface layer portion 31 and/or the second surface layer portion 33 with respect to the hafnium elements of the central portion 32 may be independently 0 or more, 0.05 or more, 0.1 or more, 0.15 or more, 0.2 or more, and/or 0.3 or more; and the mole ratio of the hafnium elements of the first surface layer portion 31 and/or the second surface layer portion 33 with respect to the hafnium elements of the central portion 32 may also be independently less than 1, 0.8 or less, 0.7 or less, and/or 0.6 or less. For example, the mole ratio of the hafnium elements of the first surface layer portion 31 and/or the second surface layer portion 33 with respect to the hafnium elements of the central portion 32 may be independently between 0 and 1. Further, the zirconium element content of the central portion 32 may be less than the zirconium element content of the first surface layer portion 31 and/or the second surface layer portion 33. For example, the mole ratio of the zirconium element of the first surface layer portion 31 or the second surface layer portion 33 with respect to the zirconium element of the central portion 32 may be independently greater than 1, greater than 1.1, greater than 1.2, and/or greater than 1.5. The mole ratio of the zirconium element of the first surface layer portion 31 or the second surface layer portion 33 with respect to the zirconium element of the central portion 32 may also be independently 100 or less, 75 or less, 60 or less, 50 or less, 40 or less, 30 or less, 25 or less, 20 or less, and/or 10 or less. For example, the mole ratio of the zirconium element of the first surface layer portion 31 or the second surface layer portion 33 with respect to the zirconium element of the central portion 32 may be independently between 1 and 100.

The first surface layer portion 31, the central portion 32, and the second surface layer portion 33 may each independently include at least one of hafnium oxide ($HfO_2$), zirconium oxide ($ZrO_2$), hafnium-zirconium oxide ($Hf_xZr_{1-x}O_2$, 0<x<1), and/or combinations thereof. For example, the first surface layer portion 31 and/or the second surface layer portion 33 may each independently include a zirconium oxide ($ZrO_2$) and/or hafnium-zirconium oxide represented by $Hf_xZr_{1-x}O_2$ (0<x<0.2), and the central portion 32 may include hafnium-zirconium oxide represented by $Hf_xZr_{1-x}O_2$ (0.2≤x<1).

The central portion 32 and the first and second surface layer portions 31 and 33 may each have a different crystal phase distribution. For example, the central portion 32 may include an orthorhombic crystal phase, and the first and second surface layer portions 31 and 33 may include a tetragonal crystal phase. For example, in some cases, the central portion 32 and the first and second surface layer portions 31 and 33 may each independently include both orthorhombic crystal structures and tetragonal crystal structures, but the central portion 32 may include more orthorhombic crystal structures than tetragonal crystal structures, and the first and second surface layer portions 31 and 33 may include more tetragonal crystal structures than orthorhombic crystal structures. The crystal structure distribution may be confirmed by a method known in the art, for example, Transmission Electron Microscopy (TEM), Grazing Incidence X-ray Diffraction (GIXRD), and the like.

The thickness of the first surface layer portion 31 and the second surface layer portion 33 may be independently 0.5% or more and 45% or less of the total thickness of the crystalline metal oxide layer 30. For example, the thickness of the first surface layer portion 31 and the second surface layer portion 33 may independently be 1% or more, 2% or more, 5% or more, 7% or more, 10% or more, or 15% or more, and/or may be 40% or less, 35% or less, or 30% or less of the total thickness of the crystalline metal oxide layer 30.

The thickness of the first surface layer portion 31, the central portion 32 and the second surface layer portion 33 may be independently greater than 0 nm, 0.1 nm or more, 0.2 nm or more, 0.3 nm or more, 0.4 nm or more, 0.5 nm or more, 0.6 nm or more, 0.7 nm or more, 0.8 nm or more, 1.0 nm or more, and/or 1.5 nm or more. The thickness of the first surface layer portion 31, the central portion 32 and the second surface layer portion 33 may also be independently 10 nm or less, 8 nm or less, 6 nm or less, 5 nm or less, 4 nm or less, 3 nm or less, 2 nm or less, and/or 1 nm or less. In addition, the ratio of the thickness of the first surface layer portion 31 or the second surface layer portion 33 with respect to the central portion 32 may be independently greater than 0, greater than 0.05, greater than 0.1, greater than 0.15, greater than 0.2, greater than 0.3, 0.4 or more, 0.5 or more, 0.6 or more, 0.8 or more, 1.0 or more, 1.2 or more, and/or 1.5 or more, and/or may also be 10 or less, 8 or less, 7 or less, 6 or less, 5 or less, 4 or less, and/or 3 or less. For example, in an example embodiment, wherein the stack structure T20 is applied in the field effect transistors D10, D20, D30, D40, and D50, the thickness of the crystalline metal oxide layer 30 may be greater than 0 and less than or equal to 5 nm, and/or the thickness of the first surface layer portion 31, the central portion 32 and the second surface layer portion 33 each may be independently greater than 0 and/or less than or equal to 3 nm, and/or the ratio of the thickness of the first surface layer portion 31 and/or the second surface layer portion 33 with respect to the central portion 32 each may be independently greater than 0 and less than or equal to 3. In addition, in an example embodiment wherein the stack structure T20 is applied in the capacitors D60 and D70, the thickness of the crystalline metal oxide layer 30 may be greater than 0 and/or less than or equal to 10 nm, and/or the thickness of the first surface layer portion 31, the central portion 32 and the second surface layer portion 33 each may be independently greater than 0 and/or less than or equal to 5 nm, and/or the ratio of the thickness of the first surface layer portion 31 and/or the second surface layer portion 33 with respect to the central portion 32 each may be independently greater than 0 and/or less than or equal to 5. The thickness may be measured according to a known method in the art, for example, an ellipsometer (SE MG-1000, Nano View) or the like.

The boundary between the first surface layer portion 31 and the central portion 32, and/or between the central portion 32 and the second surface layer portion 33 may not be clearly distinguished.

The above-described thin film structure and the semiconductor device including the same may be manufactured by forming an amorphous layer having a desired composition on a substrate and annealing the layer. For example, the thin film structure may be manufactured by sequentially forming a first amorphous layer, a second amorphous layer on the substrate, and a third amorphous layer on the substrate, annealing the first amorphous layer to form a first anti-ferroelectric layer corresponding to the first surface layer portion, annealing the second amorphous layer to form a ferroelectric layer corresponding to the central portion, and annealing the third amorphous layer to form a second anti-ferroelectric layer corresponding to the second surface layer portion.

The composition and/or thickness of the first amorphous layer, the second amorphous layer, and the third amorphous layer may respectively correspond to the composition and/or thickness of the first anti-ferroelectric layer 21, the ferroelectric layer 22, and the second anti-ferroelectric layer 23 described above. In addition, the composition and/or thickness of the first amorphous layer, the second amorphous layer, and the third amorphous layer may correspond to the composition and/or thickness of the first surface layer portion 31, the central portion 32, and the second surface layer portion 33. The composition and/or thickness of the first anti-ferroelectric layer, the ferroelectric layer, the second anti-ferroelectric layer, the first surface layer portion, the central portion, and the second surface layer portion may refer to the contents described above.

Each of the first amorphous layer, the second amorphous layer, and the third amorphous layer can be formed by a conventional method known in the art. For example, the first amorphous layer, the second amorphous layer, and the third amorphous layer may be each independently formed through deposition methods such as atomic layer deposition (ALD), chemical vapor deposition (CVD), physical vapor deposition (PVD), and/or sputtering. Among them, the ALD method has an advantage in that a uniform layer can be formed on an atomic basis and may be performed at a relatively low temperature.

When forming a first amorphous layer, a second amorphous layer, and a third amorphous layer through ALD, hafnium sources, zirconium sources, and oxygen sources may each use a precursors. For example, the hafnium source may use at least of $Hf(OtBu)_4$, Tetrakis Ethyl Methyl Amino Hafnium (TEMAH), Tetrakis Di-Methyl Amino Hafnium (TDMAH), Tetrakis Di-Ethyl Amino Hafnium (TDEAH), and/or combinations thereof, but is not limited thereto. In addition, the zirconium source may use at least one of $Zr(OtBu)_4$, Tetrakis Ethyl Methyl Amino Zirconium (TEMAZ), Tetrakis Di-Methyl Amino Zirconium (TDMAZ), Tetrakis Di-Ethyl Amino Zirconium (TDEAZ), and/or combinations thereof, but is not limited thereto. In addition, the oxygen source may use at least one of $O_3$, $H_2O$, $O_2$, $N_2O$, $O_2$ plasma, and/or combinations thereof, but is not limited thereto.

The boundary between the first amorphous layer and the second amorphous layer, and/or between the second amorphous layer and the third amorphous layer may not be clearly distinguished.

Annealing the first amorphous layer, the second amorphous layer, and the third amorphous layer may be performed under appropriate conditions such that the first amorphous layer, the second amorphous layer, and the third amorphous layer can be converted into a first anti-ferroelectric layer, a ferroelectric layer, and a second anti-ferroelectric layer, respectively. For example, annealing the first amorphous layer and the third amorphous layer may be each independently performed under conditions such that the first amorphous layer and the third amorphous layer crystallize into a tetragonal crystal phase. In addition, annealing the second amorphous layer may be performed under conditions such that the second amorphous layer can be crystallized into an orthorhombic crystal phase.

For example, annealing may be performed at a temperature of 400° C. to 1100° C., but is not limited thereto. Annealing may be performed for 1 nanosecond or more, 1 microsecond or more, 0.001 second or more, 0.01 second or more, 0.05 second or more, 0.1 second or more, 0.5 second or more, 1 second or more, 3 seconds or more, and/or 5 seconds or more, and/or 10 minutes or less, 5 minutes or less, 1 minute or less, and/or 30 seconds or less, but is not limited thereto.

Each of the annealing the first amorphous layer, annealing the second amorphous layer, and annealing the third amorphous layer may be performed individually, and/or two or more of them may be performed simultaneously. For example, a thin film structure may be manufactured through a method including forming a first amorphous layer on the substrate, forming a second amorphous layer on the first amorphous layer, forming a third amorphous layer on the second amorphous layer, and simultaneously annealing the first amorphous layer, the second amorphous layer, and the third amorphous layer to form a first anti-ferroelectric layer, a ferroelectric layer, and a second anti-ferroelectric layer, respectively. Also, the thin film structure may be manufactured through a method including forming a first amorphous layer on the substrate, forming a first anti-ferroelectric layer by annealing the first amorphous layer, forming a second amorphous layer on the first anti-ferroelectric layer, forming a ferroelectric layer by annealing the second amorphous layer, forming a third amorphous layer on the ferroelectric layer, and annealing the third amorphous layer to form a second anti-ferroelectric layer.

The capacitor can be manufactured using the thin film structure manufacturing method described above. For example, a method of manufacturing the capacitor may include forming, on a substrate including a first electrode having conductivity, a first amorphous layer, a second amorphous layer, and a third amorphous layer, and annealing the first amorphous layer, the second amorphous layer, and the third amorphous layer form a first anti-ferroelectric layer corresponding to the first surface layer portion, a ferroelectric layer corresponding to the central portion, and a second anti-ferroelectric layer corresponding to the second surface layer portion, respectively. A second electrode spaced apart from the first electrode may be formed on the third amorphous layer. The second electrode may be formed before the third amorphous layer is annealed or after the third amorphous layer is annealed.

Field effect transistors can also be manufactured using the thin film structure manufacturing method described above. For example, the field effect transistor may be manufactured by a method similar to the method of manufacturing the capacitor described above, except that a substrate including a semiconductor material is used and a gate electrode is formed instead of the second electrode. In manufacturing a field effect transistor, forming a dielectric layer on a substrate including a semiconductor material and/or forming a source and a drain on a substrate including a semiconductor material may be further included.

Hereinafter, specific example embodiments including the above-described thin film structure and semiconductor devices are presented. The specific example embodiments are presented to provide details for comparison between these specific example embodiments and some comparative example, but should not be construed as limiting the descriptions set forth herein.

Embodiment 1

Manufacturing a Capacitor Including a Thin Film Structure of $ZrO_2$(1 nm)/$Hf_{0.5}Zr_{0.5}O_2$(3 nm)/$ZrO_2$(1 nm)

A first electrode was formed through a DC sputtering and/or ALD method.

An amorphous $ZrO_2$ layer was formed with a thickness of 1 nm through ALD on the first electrode. An amorphous $Hf_{0.5}Zr_{0.5}O_2$ layer was formed with a thickness of 3 nm through ALD on the amorphous $ZrO_2$ layer. An amorphous $ZrO_2$ layer was formed with a thickness of 1 nm through ALD on the amorphous $Hf_{0.5}Zr_{0.5}O_2$ layer. As a result, amorphous $ZrO_2$ layers were disposed above and below the amorphous $Hf_{0.5}Zr_{0.5}O_2$ layer, and 80% or more of the entire surface of the amorphous $Hf_{0.5}Zr_{0.5}O_2$ layer was covered with the amorphous $ZrO_2$ layer.

The second electrode was formed on the top amorphous $ZrO_2$ layer to face the first electrode. The second electrode was formed through DC sputter and/or ALD. TiN, and/or Mo was used for the first electrode and the second electrode.

Rapid thermal annealing (RTA) was performed on the layers at a temperature between 400° C. and 1000° C. to manufacture a capacitor including a crystallized $ZrO_2$(1 nm)/$Hf_{0.5}Zr_{0.5}O_2$(3 nm)/$ZrO_2$(1 nm) metal oxide layer.

Embodiment 2

Manufacturing a Capacitor Including a $ZrO_2$(1.5 nm)/$Hf_{0.5}Zr_{0.5}O_2$(2 nm)/$ZrO_2$(1.5 nm) Thin Film Structure On the first electrode, a 1.5 nm thick amorphous $ZrO_2$ layer, a 2 nm thick amorphous $Hf_{0.5}Zr_{0.5}O_2$ layer, and a 1.5 nm thick amorphous $ZrO_2$ layer were sequentially formed to manufacture a capacitor in a substantially similar manner as in Embodiment 1 except that the amorphous $ZrO_2$ layers and the amorphous $Hf_{0.5}Zr_{0.5}O_2$ layer were deposited at different thickness to the Embodiment 1.

Embodiment 3

Manufacturing a Capacitor Including a $ZrO_2$(1.75 nm)/$Hf_{0.5}Zr_{0.5}O_2$(1.5 nm)/$ZrO_2$(1.75 nm) Thin Film Structure On the first electrode, a 1.75 nm thick amorphous $ZrO_2$ layer, a 1.5 nm thick amorphous $Hf_{0.5}Zr_{0.5}O_2$ layer, and a 1.75 nm thick amorphous $ZrO_2$ layer were sequentially formed to manufacture a capacitor in a substantially similar manner as in Embodiment 1 except that the amorphous $ZrO_2$ layers and the amorphous $Hf_{0.5}Zr_{0.5}O_2$ layer were deposited at different thicknesses to the Embodiment 1.

Embodiment 4

Manufacturing a Capacitor Including a $ZrO_2$(2 nm)/$Hf_{0.5}Zr_{0.5}O_2$(1 nm)/$ZrO_2$(2 nm) Thin Film Structure On the first electrode, a 2 nm thick amorphous $ZrO_2$ layer, a 1 nm thick amorphous $Hf_{0.5}Zr_{0.5}O_2$ layer, and a 2 nm thick amorphous $ZrO_2$ layer were sequentially formed to manufacture a capacitor in a substantially similar manner as in Embodiment 1 except that the amorphous $ZrO_2$ layer and the amorphous $Hf_{0.5}Zr_{0.5}O_2$ layer were deposited at different thicknesses to the Embodiment 1.

Embodiment 5

Manufacturing a Capacitor Including a $ZrO_2$(2.25 nm)/$Hf_{0.5}Zr_{0.5}O_2$(0.5 nm)/$ZrO_2$(2.25 nm) Thin Film Structure On the first electrode, a 2.25 nm thick amorphous $ZrO_2$ layer, a 0.5 nm thick amorphous $Hf_{0.5}Zr_{0.5}O_2$ layer, and a 2.25 nm thick amorphous $ZrO_2$ layer were sequentially formed to manufacture a capacitor in a substantially similar manner as in Embodiment 1 except that the amorphous $ZrO_2$ layer and the amorphous $Hf_{0.5}Zr_{0.5}O_2$ layer were deposited at different thicknesses to the Embodiment 1.

Comparative Example 1

Manufacturing a Capacitor Including Only a $Hf_{0.5}Zr_{0.5}O_2$(5 nm) Thin Film On a first electrode, a capacitor was manufactured in a substantially similar manner as in Embodiment 1, except that the amorphous $ZrO_2$ layers were not formed, and only the amorphous $Hf_{0.5}Zr_{0.5}O_2$ layer was formed at a 5 nm thickness.

Comparative Example 2

Manufacturing a Capacitor Including Only $ZrO_2$(5 nm)

On a first electrode, a capacitor was manufactured in a substantially manner as in Embodiment 1, except that the amorphous $Hf_{0.5}Zr_{0.5}O_2$ layer was not formed, and only an amorphous $ZrO_2$ layer was formed at a 5 nm thickness.

Comparative Example 3

Manufacturing a Capacitor Including a $Hf_{0.5}Zr_{0.5}O_2$(2 nm)/$ZrO_2$(5 nm) Thin Film Structure On a first electrode, a capacitor was manufactured in a substantially similar manner as in Embodiment 1 except that the first amorphous $ZrO_2$ layer of 2 nm thickness was not formed, and the amorphous $Hf_{0.5}Zr_{0.5}O_2$ layer of 2 nm thickness and the amorphous $ZrO_2$ layer of 5 nm thickness were sequentially formed on the substrate.

Electrical Property 1.

The P-E hysteresis curves in Embodiment 1, Embodiment 2, Comparative Example 1, and Comparative Example 3 were measured, and the anti-electric field is shown in Table 1 below. Referring to Table 1, the capacitors of Embodiments 1 and 2, including the first anti-ferroelectric layer ($ZrO_2$)/ferroelectric layer ($Hf_{0.5}Zr_{0.5}O_2$)/second anti-ferroelectric layer ($ZrO_2$) structures, have a low anti-electric field of less than 1.0 MV/cm in the P-E hysteresis curves. The capacitors of Embodiments 1 and 2 are, therefore, confirmed to have a lower hysteresis compared to Comparative Example 1 including only ferroelectric layer ($Hf_{0.5}Zr_{0.5}O_2$) and Comparative Example 3 including only ferroelectric layer ($Hf_{0.5}Zr_{0.5}O_2$)/anti-ferroelectric layer ($ZrO_2$).

TABLE 1

| | Thickness | | | Thickness ratio (First anti-ferroelectric layer/ ferroelectric layer) | Anti-electric field (MV/cm) |
|---|---|---|---|---|---|
| | First anti-ferroelectric layer ($ZrO_2$) | ferroelectric layer ($Hf_{0.5}Zr_{0.5}O_2$) | Second anti-ferroelectric layer ($ZrO_2$) | | |
| Embodiment 1 | 1 nm | 3 nm | 1 nm | 0.33 | 1.0 |
| Embodiment 2 | 1.5 nm | 2 nm | 1.5 nm | 0.75 | 0.8 |
| Comparative Example 1 | — | 5 nm | — | — | 1.1 |
| Comparative Example 3 | — | 2 nm | 5 nm | — | 1.1 |

Electrical Property 2

The electrical capacities of the capacitors of Embodiments 1 to 5 and Comparative Examples 1 and 2 were measured and are shown in Table 2. Referring to Table 2, it was confirmed that the capacitors of Embodiments 1 to 5, including the first anti-ferroelectric layer ($ZrO_2$)/ferroelectric layer ($Hf_{0.5}Zr_{0.5}O_2$)/second anti-ferroelectric layer ($ZrO_2$) structure in which the thickness ratio of the anti-ferroelectric layer with respect to the ferroelectric layer is greater than 0 and less than 10, have a higher electric capacity than the capacitor of Comparative Example 1 including only a ferroelectric layer ($Hf_{0.5}Zr_{0.5}O_2$). In addition, it was confirmed that the capacitors of Embodiments 2 to 5, in which the ratio of the thickness of the anti-ferroelectric layer with respect to the ferroelectric layer was 0.5 or more and 10 or less, have a higher electric capacity compared to the capacitor of Comparative Example 1 including only the ferroelectric layer ($Hf_{0.5}Zr_{0.5}O_2$) and Comparative Example 2 including only the anti-ferroelectric layer ($ZrO_2$).

TABLE 2

| | Thickness | | | Thickness ratio (First anti-ferroelectric layer/ ferroelectric layer) | Electric capacity ($\mu F/cm^2$) |
|---|---|---|---|---|---|
| | First anti-ferroelectric layer ($ZrO_2$) | ferroelectric layer ($Hf_{0.5}Zr_{0.5}O_2$) | Second anti-ferroelectric layer ($ZrO_2$) | | |
| Embodiment 1 | 1 nm | 3 nm | 1 nm | 0.33 | 5.65 |
| Embodiment 2 | 1.5 nm | 2 nm | 1.5 nm | 0.75 | 6.74 |
| Embodiment 3 | 1.75 nm | 1.5 nm | 1.75 nm | 1.17 | 6.91 |
| Embodiment 4 | 2 nm | 1 nm | 2 nm | 2 | 7.23 |
| Embodiment 5 | 2.25 nm | 0.5 nm | 2.25 nm | 4.5 | 6.74 |
| Comparative Example 1 | — | 5 nm | — | — | 5.05 |
| Comparative Example 2 | — | — | 5 nm | — | 6.38 |

Electrical Property 3

The dielectric constants of the capacitors of Embodiments 2 to 5 and Comparative Examples 1 to 3 were measured and are shown in Table 3. Referring to Table 3, it was confirmed that the capacitors of Embodiments 2 to 5, including the first anti-ferroelectric layer ($ZrO_2$)/ferroelectric layer ($Hf_{0.5}Zr_{0.5}O_2$)/second anti-ferroelectric layer ($ZrO_2$) structure in which the thickness ratio of the anti-ferroelectric layer with respect to the ferroelectric layer is greater than 0.5 and less than 10, have a higher electric capacity than the capacitors of Comparative Example 1 including only a ferroelectric layer ($Hf_{0.5}Zr_{0.5}O_2$), Comparative Example 2 including only an anti-ferroelectric layer (($ZrO_2$), and Comparative Example 3 including only ferroelectric layer ($Hf_{0.5}Zr_{0.5}O_2$)/anti-ferroelectric layer ($ZrO_2$).

TABLE 3

| | Thickness | | | Thickness ratio (First anti-ferroelectric layer/ ferroelectric layer) | Dielectric constant |
|---|---|---|---|---|---|
| | First anti-ferroelectric layer ($ZrO_2$) | Ferroelectric layer ($Hf_{0.5}Zr_{0.5}O_2$) | Second anti-ferroelectric layer ($ZrO_2$) | | |
| Embodiment 2 | 1.5 nm | 2 nm | 1.5 nm | 0.75 | 42.1 |
| Embodiment 3 | 1.75 nm | 1.5 nm | 1.75 nm | 1.17 | 42.9 |

TABLE 3-continued

|  | Thickness | | | Thickness ratio (First anti-ferroelectric layer/ ferroelectric layer) | Dielectric constant |
|---|---|---|---|---|---|
|  | First anti-ferroelectric layer ($ZrO_2$) | Ferroelectric layer ($Hf_{0.5}Zr_{0.5}O_2$) | Second anti-ferroelectric layer ($ZrO_2$) | | |
| Embodiment 4 | 2 nm | 1 nm | 2 nm | 2 | 44.7 |
| Embodiment 5 | 2.25 nm | 0.5 mn | 2.25 nm | 4.5 | 42.1 |
| Comparative Example 1 | — | 5 nm | — | — | 31.5 |
| Comparative Example 2 | — | — | 5 nm | — | 39.7 |
| Comparative Example 3 | — | 2 nm | 5 nm | — | 38.6 |

Embodiment 6

Manufacturing a Capacitor of p-Si/$SiO_2$/$ZrO_2$(0.5 nm)/$Hf_{0.5}Zr_{0.5}O_2$(1 nm)/$ZrO_2$(0.5 nm)/Electrode Structure A polysilicon (p-Si) substrate was prepared, and the surface was partially oxidized to form a silicon oxide layer ($SiO_2$).

On the silicon oxide layer ($SiO_2$), an amorphous $ZrO_2$ layer was formed with a thickness of 0.5 nm through ALD. An amorphous $Hf_{0.5}Zr_{0.5}O_2$ layer was formed with a thickness of 1.5 nm through ALD on the amorphous $ZrO_2$ layer. An amorphous $ZrO_2$ layer was formed with a thickness of 0.5 nm through ALD on the amorphous $Hf_{0.5}Zr_{0.5}O_2$ layer. Electrodes were formed on the amorphous $ZrO_2$ layer through DC sputtering and/or ALD. TiN or Mo was used for the electrodes.

RTA was performed on the structure formed at a temperature between 400° C. and 1100° C. to manufacture a capacitor including a crystallized $ZrO_2$(1 nm)/$Hf_{0.5}Zr_{0.5}O_2$ (3 nm)/$ZrO_2$ (1 nm) metal oxide layer.

Comparative Example 4

Manufacturing a Capacitor of p-Si/$SiO_2$/$Hf_{0.5}Zr_{0.5}O_2$(2 nm)/Electrode Structure On a silicon oxide layer ($SiO_2$), a capacitor was manufactured in a substantially similar manner as in Embodiment 6, except that the amorphous $ZrO_2$ layers were not formed, and only an amorphous $Hf_{0.5}Zr_{0.5}O_2$ layer was formed at 2 nm.

Comparative Example 5

Manufacturing a Capacitor of p-Si/$SiO_2$/$ZrO_2$(2 nm)/Electrode Structure

On a silicon oxide layer ($SiO_2$), a capacitor was manufactured in a substantially similar same manner as in Embodiment 6, except that an amorphous $Hf_{0.5}Zr_{0.5}O_2$ layer was not formed, and only an amorphous $ZrO_2$ layer was formed at 2 nm.

Comparative Example 6

Manufacturing a Capacitor of p-Si/$SiO_2$/ $Hf_{0.5}Zr_{0.5}O_2$(1.5 nm)/$ZrO_2$(0.5 nm)/Electrode Structure On a silicon oxide layer ($SiO_2$), a capacitor was manufactured in a substantially similar manner as in Embodiment 6 except that the amorphous $ZrO_2$ layer was not formed and only the amorphous $Hf_{0.5}Zr_{0.5}O_2$ layer was formed at 2 nm.

Electrical Property 4

The equivalent oxide thicknesses (EOT) of the capacitors of Embodiment 6 and Comparative Examples 4 to 6 are shown in Table 4. Referring to Table 4, it was confirmed that the capacitor of Embodiment 6 has a lower EOT than the capacitors of Comparative Example 4 including only a ferroelectric layer ($Hf_{0.5}Zr_{0.5}O_2$), Comparative Example 5 including only an anti-ferroelectric layer ($ZrO_2$), and Comparative Example 6 including only Ferroelectric layer ($Hf_{0.5}Zr_{0.5}O_2$)/anti-ferroelectric layer ($ZrO_2$).

For reference, in relation to a metal-oxide-silicon (MOS) capacitor having the same structure as in Embodiment 6 and Comparative Examples 4 to 6, as a structure similar to a field effect transistor, it is known that the performance of a MOS capacitor corresponds to that of a field effect transistor.

TABLE 4

|  | Thickness | | | Thickness ratio (First anti-ferroelectric layer/ ferroelectric layer) | EOT (nm) |
|---|---|---|---|---|---|
|  | First anti-ferroelectric layer ($ZrO_2$) | Ferroelectric layer ($Hf_{0.5}Zr_{0.5}O_2$) | Second anti-ferroelectric layer ($ZrO_2$) | | |
| Embodiment 6 | 0.5 nm | 1 mn | 0.5 nm | 0.5 | 0.83 |
| Comparative Example 4 | — | 2 nm | — | — | 0.87 |
| Comparative Example 5 | — | — | 2 nm | — | 0.87 |
| Comparative Example 6 | — | 1.5 nm | 0.55 nm | — | 0.91 |

Embodiment 7

Manufacturing a Field Effect Transistor Including a $ZrO_2$(0.5 nm)/$Hf_{0.5}Zr_{0.5}O_2$(1 nm)/$ZrO_2$(0.5 nm) Thin Film Structure

Except for forming a source and a drain in the polysilicon (p-Si) substrate, an $SiO_2$ layer, an amorphous $ZrO_2$ layer (0.5 nm), an amorphous $Hf_{0.5}Zr_{0.5}O_2$ layer (1 nm), and an amorphous $ZrO_2$ layer (0.5 nm) are sequentially formed on a polysilicon (p-Si) substrate and TiN and/or Mo is formed as a (gate) electrode through a substantially similar manner as in Embodiment 6, thereby manufacturing a field effect transistor. Here, the field effect transistor was manufactured in the form of Fin-FET using a method commonly known in the art, such as photolithography and etching.

Embodiment 8

Manufacturing a Field Effect Transistor Including a $ZrO_2$(0.25 nm)/$Hf_{0.5}Zr_{0.5}O_2$(1.5 nm)/$ZrO_2$(0.25 nm) Thin Film Structure

On the silicon oxide layer ($SiO_2$), a 0.25 nm thick amorphous $ZrO_2$ layer, a 1.5 nm thick amorphous $Hf_{0.5}Zr_{0.5}O_2$ layer, and a 0.25 nm thick amorphous $ZrO_2$ layer were sequentially formed to manufacture a field effect transistor in a substantially similar manner as in Embodiment 7 except that the thicknesses of the amorphous $ZrO_2$ layer and the amorphous $Hf_{0.5}Zr_{0.5}O_2$ layer are different.

Comparative Example 7

Manufacturing a Field Effect Transistor Including a $Hf_{0.5}Zr_{0.5}O_2$(2 nm) Thin Film Structure

On the silicon oxide layer ($SiO_2$), a field effect transistor was manufactured in a substantially similar manner as in Embodiment 7, except that an amorphous $ZrO_2$ layer was not formed, and only an amorphous $Hf_{0.5}Zr_{0.5}O_2$ layer was formed at 2 nm.

Comparative Example 8

Manufacturing a Field Effect Transistor Including a $ZrO_2$(2 nm) Thin Film Structure

On the silicon oxide layer ($SiO_2$), a field effect transistor was manufactured in a substantially similar manner as in Embodiment 7 except that the amorphous $Hf_{0.5}Zr_{0.5}O_2$ layer was not formed and only the amorphous $ZrO_2$ layer was formed at 2 nm.

Electrical Property 5

Table 5 shows the subthreshold swing values SS of the field effect transistors of Embodiment 7, Embodiment 8, Comparative Example 7, and Comparative Example 8. The sub-threshold swing value is a rate of change of the drain current with respect to the gate voltage and can be obtained by measuring the slope (SS=$\Delta$Id/$\Delta$Vg) of the Id-Vg characteristic of the transistor, and the subthreshold swing value SS of Table 5 is a value measured at 0.2 to 0.25V from the threshold voltage. Referring to Table 5, it was confirmed that the field effect transistors of Embodiments 7 and 8 have a lower subthreshold swing value SS compared to Comparative Example 7 including only a ferroelectric layer ($Hf_{0.5}Zr_{0.5}O_2$) and Comparative Example 8 including only an anti-ferroelectric layer ($ZrO_2$).

TABLE 5

| | Thickness | | | Thickness ratio | |
| --- | --- | --- | --- | --- | --- |
| | First anti-ferroelectric layer ($ZrO_2$) | Ferroelectric layer ($Hf_{0.5}Zr_{0.5}O_2$) | Second anti-ferroelectric layer ($ZrO_2$) | (First anti-ferroelectric layer/ ferroelectric layer) | SS (mV/dec) |
| Embodiment 7 | 0.5 nm | 1 nm | 0.5 nm | 0.5 | 94.9 |
| Embodiment 8 | 0.25 nm | 1.5 nm | 0.25 nm | 0.17 | 90.7 |
| Comparative Example 7 | — | 2 nm | — | — | 101.6 |
| Comparative Example 8 | — | — | 2 nm | — | 98.7 |

According to the above example embodiments, a thin film structure having a negative capacitance effect may be provided. A semiconductor device having a low hysteresis, a semiconductor device having an improved capacitance, and/or a semiconductor device having an improved subthreshold swing value SS in a change in polarization according to an external electric field may be provided. These thin film structures and semiconductor devices may be applied to various electronic devices, electronic apparatuses, electronic circuits, and the like. Although the embodiments have been described in detail above, the scope of rights is not limited thereto and various modifications and improvements of those skilled in the art using the basic concepts defined in the following claims also belong to the scope of rights.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A stack structure comprising:
    a substrate; and
    a thin film structure on the substrate, the thin film structure comprising
        a first anti-ferroelectric layer parallel to the substrate,
        a second anti-ferroelectric layer parallel to the substrate, and a ferroelectric layer parallel to the substrate, the ferroelectric layer between the first anti-ferroelectric layer and the second anti-ferroelectric layer,
wherein the ferroelectric layer is capacitance matched with at least one of the first anti-ferroelectric layer or the second anti-ferroelectric layer.

2. The stack structure of claim 1, wherein at least one of the first anti-ferroelectric layer and the second anti-ferroelectric layer cover 80% or more of a surface of the ferroelectric layer.

3. The stack structure of claim 1, wherein at least one of the first anti-ferroelectric layer and the second anti-ferroelectric layer are in direct contact with the ferroelectric layer.

4. The stack structure of claim 1, wherein at least one of the ferroelectric layer, the first anti-ferroelectric layer, and the second anti-ferroelectric layer independently comprises at least one of hafnium oxide ($HfO_2$), zirconium oxide ($ZrO_2$), and hafnium-zirconium oxide ($Hf_xZr_{1-x}O_2$, $0<x<1$).

5. The stack structure of claim 4, wherein the ferroelectric layer comprises the hafnium-zirconium oxide represented by $Hf_xZr_{1-x}O_2$ ($0.2 \leq x<1$).

6. The stack structure of claim 4, wherein each of the first anti-ferroelectric layer and the second anti-ferroelectric layer independently comprises at least one of the zirconium oxide and the hafnium-zirconium oxide represented by $Hf_xZr_{1-x}O2$ ($0<x<0.2$).

7. The stack structure of claim 4, wherein a hafnium element content of the ferroelectric layer is greater than a hafnium element content of one or more of the first anti-ferroelectric layer and the second anti-ferroelectric layer.

8. The stack structure of claim 4, wherein a mole ratio of a hafnium element of at least one of the first anti-ferroelectric layer and the second anti-ferroelectric layer with respect to a hafnium element of the ferroelectric layer is between 0 and 0.8.

9. The stack structure of claim 4, wherein a zirconium element content of the ferroelectric layer is less than a zirconium element content of one or more of the first anti-ferroelectric layer and the second anti-ferroelectric layer.

10. The stack structure of claim 4, wherein a mole ratio of a zirconium element of at least one of the first anti-ferroelectric layer and the second anti-ferroelectric layer with respect to a zirconium element of the ferroelectric layer is between 1 and 100.

11. The thin film structure of claim 4,
wherein at least one of the ferroelectric layer, the first anti-ferroelectric layer, and the second anti-ferroelectric layer comprise one or more dopant material, the dopant material including at least one of C, Si, Ge, Sn, Pb, Al, Y, La, Gd, Mg, Ca, Sr, Ba, Ti, Zr, and Hf.

12. The stack structure of claim 11, wherein a content of the dopant material in the ferroelectric layer is less than a content of at least one dopant material in the first anti-ferroelectric layer and the second anti-ferroelectric layer.

13. The stack structure of claim 11, wherein the ferroelectric layer has a content of the dopant material between 0 at % and 10 at % compared to a metal element of a base material.

14. The stack structure of claim 11, wherein each of the first anti-ferroelectric layer and the second anti-ferroelectric layer independently has a content of the dopant material between 4 at % and 20 at % compared to a metal element of a base material.

15. The stack structure of claim 1, wherein the ferroelectric layer comprises an orthorhombic crystal structure, and wherein the first anti-ferroelectric layer and the second anti-ferroelectric layer comprise a tetragonal crystal structure.

16. The stack structure of claim 1, wherein a thickness of each of the first anti-ferroelectric layer, the ferroelectric layer, and the second anti-ferroelectric layer is independently between 0.1 nm and 10 nm.

17. The stack structure of claim 1, wherein a ratio of a thickness of at least one of the first anti-ferroelectric layer and the second anti-ferroelectric layer with respect to the ferroelectric layer is between 0 and 10.

18. The stack structure of claim 1, wherein the thin film structure further comprises a paraelectric layer.

19. The stack structure of claim 18, wherein the paraelectric layer is between the ferroelectric layer and at least one of the first anti-ferroelectric layer and the second anti-ferroelectric layer.

20. The stack structure of claim 18, wherein the paraelectric layer includes at least one of aluminum oxide ($Al_2O_3$), lanthanum oxide ($La_2O_3$), yttrium oxide ($Y_2O_3$), and silicon oxide ($SiO_2$).

21. A semiconductor device comprising the stack structure of claim 1.

22. The semiconductor device of claim 21, further comprising:
a first electrode; and
a second electrode spaced apart from the first electrode,
wherein the stack structure is between the first electrode and the second electrode, and the substrate includes at least one of the first electrode and the second electrode.

23. The semiconductor device of claim 22, wherein, in a polarization change according to an external electric field, a coercive electric field of the semiconductor device is 1 MV/cm or less.

24. The semiconductor device of claim 22, wherein a sum of thicknesses of the first anti-ferroelectric layer, the ferroelectric layer, and the second anti-ferroelectric layer is between 0 and 10 nm.

25. The semiconductor device of claim 22, wherein a ratio of a thickness of at least one of the first anti-ferroelectric layer and the second anti-ferroelectric layer with respect to the ferroelectric layer is between 0 and 10.

26. A semiconductor apparatus including the semiconductor device of claim 22, further comprising:
a field effect transistor including a semiconductor layer including a source and a drain, a dielectric layer on the semiconductor layer, and a gate electrode on the dielectric layer,
wherein the field effect transistor and the semiconductor device are electrically connected to each other.

27. The semiconductor device of claim 21, further comprising:
a semiconductor layer including a source and a drain; and
a gate electrode on the semiconductor layer,
wherein the thin film structure is between the semiconductor layer and the gate electrode, and
wherein one of the semiconductor layer or the gate electrode corresponds to the substrate.

28. The semiconductor device of claim 27, wherein a sum of thicknesses of the first anti-ferroelectric layer, the ferroelectric layer, and the second anti-ferroelectric layer is between 0 and 5 nm.

29. The semiconductor device of claim 27, further comprising:
a dielectric layer between the semiconductor layer and the gate electrode.

30. The semiconductor device of claim 29, wherein the dielectric layer comprises a paraelectric layer.

31. The semiconductor device of claim 29, wherein the dielectric layer comprises at least one of silicon oxide, silicon nitride, aluminum oxide, hafnium oxide, and zirconium oxide.

32. The semiconductor device of claim 29, wherein a thickness of the dielectric layer is between 0.1 nm and 5 nm.

33. The semiconductor device of claim 27, wherein, in a polarization change according to an external electric field, a coercive electric field of the semiconductor device is 1 MV/cm or less.

34. The semiconductor device of claim 27, wherein a hysteresis window of the semiconductor device is 10 mV or less at 1 V operating voltage in a voltage-to-current curve.

35. The semiconductor device of claim 27, wherein the semiconductor device has non-memory characteristics.

36. An electronic apparatus comprising the semiconductor device of claim 21 or the semiconductor apparatus of claim 26.

37. A stack structure comprising:
a substrate; and
a crystalline metal oxide layer on the substrate, the crystalline metal oxide layer including at least of hafnium oxide ($HfO_2$), zirconium oxide ($ZrO_2$), and hafnium-zirconium oxide ($Hf_xZr_{1-x}O_2$, $0<x<1$),
wherein the crystalline metal oxide layer has a first surface layer portion, a central portion, and a second surface layer portion sequentially stacked in a thickness direction,
wherein a hafnium element content of the central portion is greater than a hafnium element content of one or more of the first surface layer portion and the second surface layer portion, and
wherein the central portion is a ferroelectric portion and is capacitance matched with the one or more of the first surface layer portion and the second surface layer portion.

38. The stack structure of claim 37, wherein at least one of the first surface layer portion and the second surface layer portion comprises at least one of the zirconium oxide and the hafnium-zirconium oxide represented by $Hf_xZr_{1-x}O_2$, ($0<x<0.2$).

39. The stack structure of claim 37, wherein the central portion comprises the hafnium-zirconium oxide represented by $Hf_xZr_{1-x}O_2$ ($0.2 \leq x<1$).

40. The stack structure of claim 37, wherein a thickness of each of the first surface layer portion and the second surface layer portion is independently between 0.5% and 45% of a thickness of the crystalline metal oxide layer.

41. The stack structure of claim 37,
wherein the central portion comprises an orthorhombic crystal structure,
wherein the first surface layer portion and the second surface layer portion comprise a tetragonal crystal structure.

42. The stack structure of claim 37, further comprising a paraelectric layer.

43. A semiconductor device comprising the stack structure of claim 37.

* * * * *